(12) United States Patent
Do et al.

(10) Patent No.: US 9,219,029 B2
(45) Date of Patent: Dec. 22, 2015

(54) INTEGRATED CIRCUIT PACKAGING SYSTEM WITH TERMINALS AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/326,806

(22) Filed: Dec. 15, 2011

(65) Prior Publication Data
US 2013/0154119 A1  Jun. 20, 2013

(51) Int. Cl.
| | |
|---|---|
| H01L 29/40 | (2006.01) |
| H01L 23/495 | (2006.01) |
| H01L 23/498 | (2006.01) |
| H01L 21/48 | (2006.01) |
| H01L 23/31 | (2006.01) |
| H01L 23/00 | (2006.01) |

(52) U.S. Cl.
CPC ...... *H01L 23/49582* (2013.01); *H01L 21/4821* (2013.01); *H01L 23/3107* (2013.01); *H01L 23/49861* (2013.01); H01L 21/4832 (2013.01); H01L 24/16 (2013.01); H01L 24/32 (2013.01); H01L 24/48 (2013.01); H01L 2224/16225 (2013.01); H01L 2224/16245 (2013.01); H01L 2224/17106 (2013.01); H01L 2224/2919 (2013.01); H01L 2224/32225 (2013.01); H01L 2224/32245 (2013.01); H01L 2224/48011 (2013.01); H01L 2224/48227 (2013.01); H01L 2224/48247 (2013.01); H01L 2224/49109 (2013.01); H01L 2224/73265 (2013.01); H01L 2224/92247 (2013.01); H01L 2224/97 (2013.01); H01L 2924/00014 (2013.01); H01L 2924/10253 (2013.01); H01L 2924/15153 (2013.01)

(58) Field of Classification Search
USPC .......... 438/106–126; 257/737, 778, E21.502, 257/E23.068
See application file for complete search history.

(56) References Cited

U.S. PATENT DOCUMENTS

| | | | | |
|---|---|---|---|---|
| 4,714,952 | A * | 12/1987 | Takekawa et al. ............. | 257/665 |
| 5,707,881 | A * | 1/1998 | Lum ............................... | 438/15 |
| 5,898,217 | A | 4/1999 | Johnston | |
| 6,184,574 | B1 * | 2/2001 | Bissey ........................... | 257/666 |
| 6,194,291 | B1 * | 2/2001 | DiStefano et al. ............. | 438/455 |
| 6,238,952 | B1 | 5/2001 | Lin | |
| 6,335,565 | B1 | 1/2002 | Miyamoto et al. | |
| 6,492,719 | B2 | 12/2002 | Miyamoto et al. | |
| 6,562,660 | B1 | 5/2003 | Sakamoto et al. | |
| 6,731,013 | B2 * | 5/2004 | Juso et al. ....................... | 257/779 |
| 6,734,550 | B2 | 5/2004 | Martin et al. | |
| 6,889,429 | B2 * | 5/2005 | Celaya et al. ................... | 29/840 |
| 6,970,005 | B2 * | 11/2005 | Rincon et al. ............. | 324/756.03 |

(Continued)

OTHER PUBLICATIONS

U.S. Appl. No. 13/102,041, filed May 5, 2011, Do et al.

(Continued)

*Primary Examiner* — Yu-Hsi D Sun
*Assistant Examiner* — Ankush Singal
(74) *Attorney, Agent, or Firm* — Ishimaru & Associates LLP

(57) ABSTRACT

A method of manufacture of an integrated circuit packaging system includes: forming a lead having a lead top side; forming a lower interior conductive layer directly on the lead top side; forming an interior insulation layer directly on the lower interior conductive layer; forming an upper interior conductive layer directly on the interior insulation layer; and mounting an integrated circuit over the upper interior conductive layer.

20 Claims, 11 Drawing Sheets

(56) References Cited

U.S. PATENT DOCUMENTS

| | | | |
|---|---|---|---|
| 7,049,177 B1* | 5/2006 | Fan et al. | 438/123 |
| 7,060,535 B1 | 6/2006 | Sirinorakul et al. | |
| 7,199,453 B2* | 4/2007 | Lai et al. | 257/666 |
| 7,291,908 B2* | 11/2007 | Pan et al. | 257/690 |
| 7,405,106 B2 | 7/2008 | Maloney et al. | |
| 7,548,430 B1 | 6/2009 | Huemoeller et al. | 361/760 |
| 7,554,179 B2 | 6/2009 | Shim et al. | |
| 7,618,846 B1* | 11/2009 | Pagaila et al. | 438/113 |
| 7,622,801 B2 | 11/2009 | Kurita | |
| 7,777,351 B1* | 8/2010 | Berry et al. | 257/778 |
| 7,786,557 B2 | 8/2010 | Hsieh et al. | |
| 7,791,203 B2 | 9/2010 | Boon et al. | |
| 7,923,304 B2 | 4/2011 | Choi et al. | |
| 7,928,552 B1 | 4/2011 | Cho et al. | |
| 7,936,048 B2* | 5/2011 | Otremba | 257/621 |
| 7,986,048 B2* | 7/2011 | Park et al. | 257/787 |
| 7,989,270 B2 | 8/2011 | Huang et al. | |
| 8,053,275 B2 | 11/2011 | Hasegawa | |
| 8,097,490 B1 | 1/2012 | Pagaila et al. | |
| 8,133,762 B2 | 3/2012 | Pagaila et al. | |
| 8,174,109 B2 | 5/2012 | Uchiyama | |
| 8,178,976 B2* | 5/2012 | Dunne et al. | 257/774 |
| 8,193,037 B1* | 6/2012 | Bathan et al. | 438/111 |
| 8,258,008 B2* | 9/2012 | Lee et al. | 438/109 |
| 8,283,205 B2 | 10/2012 | Pagaila et al. | |
| 8,372,689 B2 | 2/2013 | Lee et al. | |
| 2001/0005601 A1 | 6/2001 | Shin et al. | |
| 2002/0030972 A1* | 3/2002 | Ali et al. | 361/704 |
| 2002/0084522 A1* | 7/2002 | Yoshizawa et al. | 257/692 |
| 2002/0117743 A1 | 8/2002 | Nakatani et al. | |
| 2002/0134582 A1* | 9/2002 | Celaya et al. | 174/261 |
| 2003/0006055 A1 | 1/2003 | Chien-Hung et al. | |
| 2003/0203540 A1* | 10/2003 | Hur | 438/111 |
| 2004/0063246 A1* | 4/2004 | Karnezos | 438/108 |
| 2004/0262724 A1* | 12/2004 | Hsu | 257/678 |
| 2005/0146018 A1* | 7/2005 | Jang et al. | 257/698 |
| 2005/0156291 A1* | 7/2005 | Shiu et al. | 257/666 |
| 2005/0161251 A1* | 7/2005 | Mori et al. | 174/250 |
| 2005/0248041 A1 | 11/2005 | Kuah et al. | |
| 2005/0258529 A1* | 11/2005 | Green et al. | 257/686 |
| 2005/0263320 A1* | 12/2005 | Igarashi et al. | 174/255 |
| 2006/0033516 A1* | 2/2006 | Rincon et al. | 324/754 |
| 2006/0060960 A1* | 3/2006 | Cho et al. | 257/700 |
| 2006/0118941 A1* | 6/2006 | Lai et al. | 257/698 |
| 2006/0125080 A1 | 6/2006 | Hsu | |
| 2007/0018292 A1* | 1/2007 | Sutardja | 257/678 |
| 2007/0132089 A1 | 6/2007 | Jiang et al. | |
| 2007/0145548 A1* | 6/2007 | Park et al. | 257/678 |
| 2007/0170559 A1* | 7/2007 | Camacho et al. | 257/676 |
| 2007/0181989 A1 | 8/2007 | Corisis et al. | |
| 2007/0219033 A1* | 9/2007 | Otremba | 474/213 |
| 2008/0006942 A1 | 1/2008 | Park et al. | |
| 2008/0036050 A1 | 2/2008 | Lin et al. | |
| 2008/0182398 A1* | 7/2008 | Carpenter et al. | 438/612 |
| 2009/0014859 A1 | 1/2009 | Jeung et al. | |
| 2009/0039523 A1 | 2/2009 | Jiang et al. | |
| 2009/0152740 A1* | 6/2009 | Park et al. | 257/778 |
| 2009/0184412 A1 | 7/2009 | Yasunaga | |
| 2009/0236752 A1* | 9/2009 | Lee et al. | 257/777 |
| 2009/0278244 A1* | 11/2009 | Dunne et al. | 257/676 |
| 2010/0001384 A1 | 1/2010 | Bathan et al. | |
| 2010/0032821 A1 | 2/2010 | Pagaila et al. | |
| 2010/0044850 A1 | 2/2010 | Lin et al. | |
| 2010/0072570 A1 | 3/2010 | Pagaila et al. | |
| 2010/0181658 A1* | 7/2010 | Yamashita | 257/676 |
| 2010/0216281 A1* | 8/2010 | Pagaila et al. | 438/107 |
| 2010/0244208 A1* | 9/2010 | Pagaila et al. | 257/659 |
| 2010/0244219 A1 | 9/2010 | Pagaila et al. | |
| 2011/0062598 A1* | 3/2011 | Lam | 257/777 |
| 2011/0068478 A1 | 3/2011 | Pagaila et al. | |
| 2011/0147901 A1* | 6/2011 | Huang et al. | 257/660 |
| 2011/0244636 A1 | 10/2011 | Kondo | |
| 2011/0254172 A1 | 10/2011 | Park et al. | |
| 2012/0061822 A1* | 3/2012 | Pagaila | 257/737 |
| 2012/0119360 A1 | 5/2012 | Kim et al. | |
| 2012/0146235 A1* | 6/2012 | Choi et al. | 257/774 |
| 2012/0168963 A1 | 7/2012 | Huang et al. | |
| 2012/0181689 A1 | 7/2012 | Do et al. | |
| 2012/0199972 A1 | 8/2012 | Pagaila et al. | |
| 2012/0200303 A1* | 8/2012 | Guo et al. | 324/613 |
| 2012/0273931 A1* | 11/2012 | Yang et al. | 257/676 |
| 2012/0273947 A1 | 11/2012 | Mo | |
| 2012/0280377 A1* | 11/2012 | Do et al. | 257/676 |
| 2012/0280408 A1* | 11/2012 | Do et al. | 257/782 |
| 2012/0319286 A1 | 12/2012 | Yang et al. | |
| 2012/0319295 A1 | 12/2012 | Chi et al. | |
| 2012/0326325 A1 | 12/2012 | Choi et al. | |
| 2013/0049218 A1 | 2/2013 | Gong et al. | |
| 2013/0052777 A1 | 2/2013 | Xu et al. | |
| 2013/0062761 A1 | 3/2013 | Lin et al. | |
| 2013/0075899 A1 | 3/2013 | Huang et al. | |
| 2013/0075902 A1 | 3/2013 | Chow et al. | |
| 2013/0078915 A1 | 3/2013 | Zhao et al. | |
| 2013/0154072 A1* | 6/2013 | Do et al. | 257/676 |
| 2013/0154080 A1* | 6/2013 | Do et al. | 257/706 |

OTHER PUBLICATIONS

U.S. Appl. No. 13/102,052, filed May 5, 2011, Do et al.

* cited by examiner

INTEGRATED CIRCUIT PACKAGING SYSTEM WITH TERMINALS AND METHOD OF MANUFACTURE THEREOF

CROSS-REFERENCE TO RELATED APPLICATIONS

The present application contains subject matter related to the following concurrently filed patent applications:

U.S. patent application Ser. No. 13/326,728, now U.S. Pat. No. 8,629,567; and

U.S. patent application Ser. No. 13/326/891, now U.S. Pat. No. 8,623,711.

All of the above related applications are assigned to STATS ChipPAC Ltd., and the subject matter thereof is incorporated herein by reference thereto.

TECHNICAL FIELD

The present invention relates generally to an integrated circuit packaging system, and more particularly to a system for an integrated circuit packaging system with terminals.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems.

Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead having a lead top side; forming a lower interior conductive layer directly on the lead top side; forming an interior insulation layer directly on the lower interior conductive layer; forming an upper interior conductive layer directly on the interior insulation layer; and mounting an integrated circuit over the upper interior conductive layer.

The present invention provides an integrated circuit packaging system, including: a lead having a lead top side; a lower interior conductive layer directly on the lead top side; an interior insulation layer directly on the lower interior conductive layer; an upper interior conductive layer directly on the interior insulation layer; and an integrated circuit over the upper interior conductive layer.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
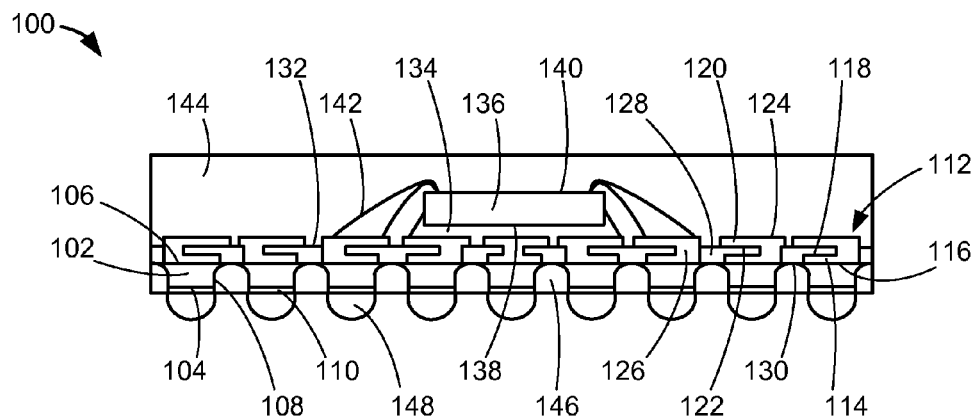
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
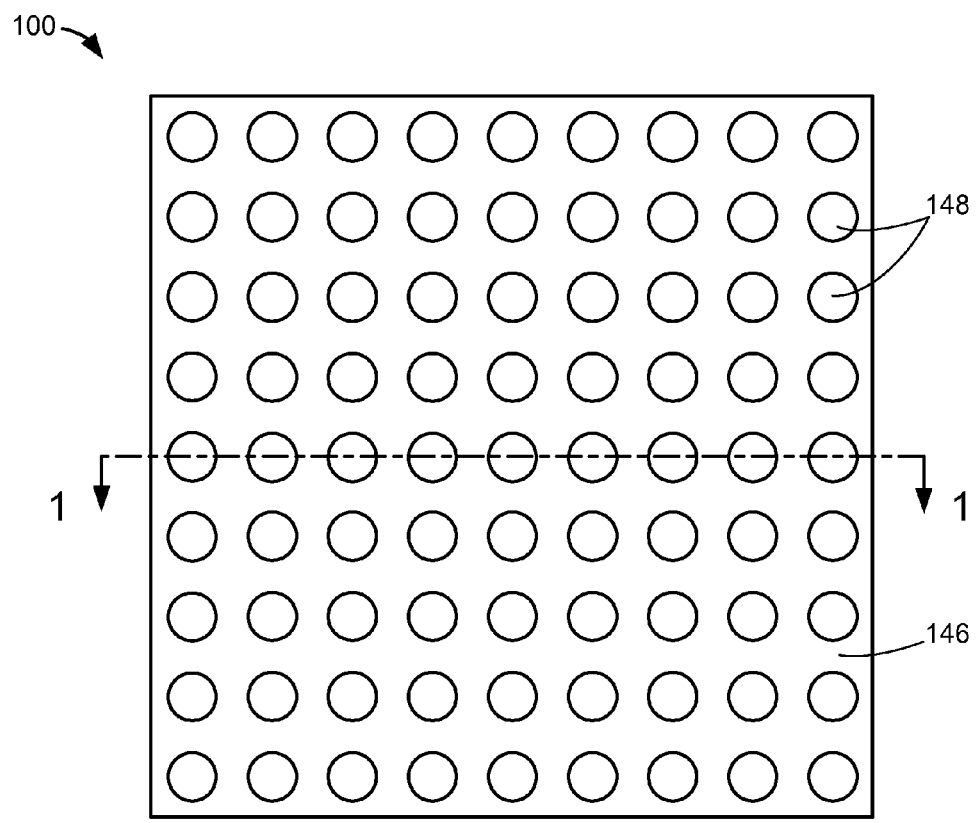
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a multiple-layer routable circuit array.

The integrated circuit packaging system 100 can include leads 102, which are defined as structures that provide connectivity between a semiconductor device and an external system (not shown). The leads 102 are structurally isolated from each other. The leads 102 can provide electrical connectivity for electrical signals or electrical potential levels. The leads 102 can conduct heat away from the semiconductor device to the external system. Each of the leads 102 can include a lead bottom side 104 and a lead top side 106 opposite the lead bottom side 104.

Each of the leads 102 can include a lead non-horizontal side 108, which is defined as a lateral side that defines a horizontal boundary of each of the leads 102. The lead non-horizontal side 108 extends from the lead bottom side 104 to the lead top side 106. The lead non-horizontal side 108 can include a curved surface.

The integrated circuit packaging system 100 can include an exterior conductive layer 110, which is defined as an attachment site providing connectivity between each of the leads 102 and the external system. The exterior conductive layer 110 can be formed directly on the lead bottom side 104.

The integrated circuit packaging system 100 can include a multi-layer conductive structure 112, which is defined as a connection structure with a number of conductive layers providing connectivity between the semiconductor device and the leads 102. The multi-layer conductive structure 112 can include a lower interior conductive layer 114 having a lower layer bottom side 116 and a lower layer top side 118 opposite the lower layer bottom side 116.

The multi-layer conductive structure 112 can include an upper interior conductive layer 120 having an upper layer bottom side 122 and an upper layer top side 124 opposite the upper layer bottom side 122. The multi-layer conductive structure 112 can include an interior connection layer 126. The multi-layer conductive structure 112 can include an interior insulation layer 128 having an interior insulation bottom side 130 and an interior insulation top side 132 opposite the interior insulation bottom side 130.

The lower interior conductive layer 114 is defined as a connection structure that provides connectivity between the leads 102 and the upper interior conductive layer 120. The upper interior conductive layer 120 is defined as a connection structure that provides connectivity between the lower interior conductive layer 114 and the semiconductor device. The lower interior conductive layer 114 and the upper interior conductive layer 120 route electrical connection or redistribute electrical signals between the semiconductor device and the leads 102.

The interior connection layer 126 is defined as a connection structure that provides electrical connectivity to multiple conductive layers. The interior connection layer 126 can be attached to the lower interior conductive layer 114 and the upper interior conductive layer 120. The interior insulation layer 128 is defined as a structure that provides electrical isolation between conductive layers.

The lower interior conductive layer 114 and the upper interior conductive layer 120 can provide electrical connectivity for electrical signals or electrical potential levels. The lower interior conductive layer 114 and the upper interior conductive layer 120 can conduct heat away from the semiconductor device to the leads 102.

The lower interior conductive layer 114 and the upper interior conductive layer 120 can include conductive traces. For example, the lower interior conductive layer 114 and the upper interior conductive layer 120 can represent connection structures including embedded routable conductive traces, additive routable conductive traces, or redistribution layers.

A portion of the lower layer bottom side 116 can be formed directly on the lead top side 106. The lower layer bottom side 116 can be coplanar with the interior insulation bottom side 130.

The interior connection layer 126 can be formed directly on the lower layer top side 118 and the upper layer bottom side 122. The interior connection layer 126 can be formed through the interior insulation layer 128. The upper layer bottom side 122 can be formed directly on the interior connection layer 126 and the interior insulation top side 132. A portion of the upper interior conductive layer 120 can be formed directly over a portion of the lower interior conductive layer 114.

The integrated circuit packaging system 100 can include an attach layer 134, which is defined as a structure for mounting the semiconductor device. The integrated circuit packaging system 100 can include an integrated circuit 136, which is defined as the semiconductor device. The integrated circuit 136 can include an inactive side 138 and an active side 140 opposite the inactive side 138. For example, the integrated circuit 136 can represent a semiconductor device including a wirebond integrated circuit die or a flip chip.

A number of the leads 102 can be directly under the integrated circuit 136. The leads 102 and a portion of the multi-layer conductive structure 112 that are directly under the integrated circuit 136 can conduct heat away from the integrated circuit 136 with the attach layer 134 attached to the multi-layer conductive structure 112 and the integrated circuit 136.

The attach layer 134 can be attached to the upper layer top side 124, the interior insulation top side 132, and the inactive side 138. The integrated circuit 136 can be mounted over the upper layer top side 124 with the inactive side 138 facing the upper layer top side 124.

The integrated circuit packaging system 100 can include internal connectors 142, which are defined as electrically conductive connectors. The internal connectors 142 can be attached to the upper layer top side 124 and the active side 140. For example, the internal connectors 142 can represent electrically conductive connectors including bond wires, conductive balls, and conductive bumps.

The integrated circuit packaging system 100 can include an encapsulation 144, which is defined as a package cover of the semiconductor package to hermetically seal the semiconductor device providing mechanical and environmental protection. The encapsulation 144 can be formed over the upper layer top side 124, the attach layer 134, the integrated circuit 136, and the internal connectors 142.

A bottom extent of the encapsulation 144 can be coplanar with the upper layer bottom side 122. The bottom extent of the encapsulation 144 can be directly on a portion of the interior insulation top side 132.

The integrated circuit packaging system 100 can include a protection layer 146, which is defined as an insulation layer that protects a portion of the lower layer bottom side 116. The protection layer 146 can be formed covering or directly on the lead non-horizontal side 108, a non-horizontal side of the exterior conductive layer 110, a portion of the lower layer bottom side 116, and a portion of a bottom extent of the interior insulation layer 128. The protection layer 146 can be formed between the leads 102. A top extent of the protection layer 146 can be coplanar with the lead top side 106.

For illustration purposes, a bottom extent of the exterior conductive layer 110 and a bottom extent of the protection layer 146 are shown coplanar with each other, although it is understood that a bottom extent of the exterior conductive layer 110 can be below or above a bottom extent of the protection layer 146. For example, a bottom extent of the protection layer 146 can be above a bottom extent of the exterior conductive layer 110. Also for example, the lead bottom side 104 and a bottom extent of the protection layer 146 can be coplanar with each other.

The integrated circuit packaging system 100 can optionally include external connectors 148, which are defined as electrically conductive connectors. The external connectors 148 can be attached to a bottom extent of the exterior conductive layer 110 and the external system. The external connectors 148 can represent electrical connectors including conductive balls.

It has been discovered that the multi-layer conductive structure 112 provides improved reliability with the upper interior conductive layer 120 and the lower interior conductive layer 114 directly on the lead top side 106 providing increased spacing for routability thereby providing reduced wire span and eliminating electrical shorts between traces.

It has also been discovered that the protection layer 146 provides improved reliability with a bottom extent of the protection layer 146 coplanar with a bottom extent of the exterior conductive layer 110 and the lead non-horizontal side 108 covered by the protection layer 146 to provide terminal interlocking resulting in elimination of lead pullouts.

It has further been discovered that the upper interior conductive layer 120 electrically connected to the leads 102 and the integrated circuit 136 provides improved reliability by reducing wire span of the internal connectors 142.

Referring now to FIG. 2, therein is shown a bottom view of the integrated circuit packaging system 100. The bottom view depicts an array of the external connectors 148 within a perimeter of the protection layer 146.

Figure 3:
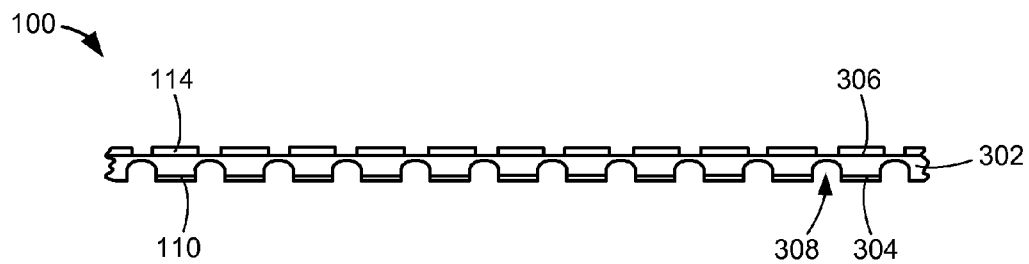
FIG. 3 is a cross-sectional view of the integrated circuit packaging system in a carrier-providing phase of manufacture.

Referring now to FIG. 3, therein is shown a cross-sectional view of the integrated circuit packaging system 100 in a carrier-providing phase of manufacture. The integrated circuit packaging system 100 can include a carrier 302, which is defined as a support structure formed with a conductive material. The carrier 302 can include a conductive material including copper (Cu), any other metals, or metallic alloys. The carrier 302 can represent a support structure including a leadframe or a substrate.

The carrier 302 can include a carrier bottom side 304 and a carrier top side 306 opposite the carrier bottom side 304. The carrier bottom side 304 can be plated with the exterior conductive layer 110. The carrier top side 306 can be plated with the lower interior conductive layer 114 directly thereon. The carrier 302 can include a carrier recess portion 308 at the carrier bottom side 304. For example, the lower interior conductive layer 114 can include an additive routable conductive trace. For example, the carrier 302 can be partially removed with a removal process including pre-plated leadframe (PPF) selective etching to form the carrier recess portion 308.

For illustration purposes, the carrier 302 is shown pre-etched at the carrier bottom side 304, although it is understood that the carrier 302 can optionally be non-etched and partially removed at a subsequent phase. For example, the carrier 302 can be partially removed at the carrier bottom side 304 with the removal process after molding in a subsequent phase.

Figure 4:
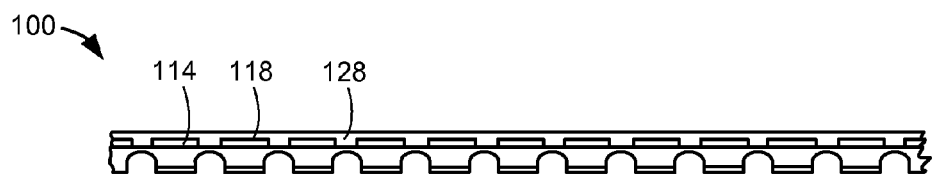
FIG. 4 is the structure of FIG. 3 in an insulation-application phase.

Referring now to FIG. 4, therein is shown the structure of FIG. 3 in an insulation-application phase. The interior insulation layer 128 can be formed over the lower interior conductive layer 114 covering the lower layer top side 118. The lower interior conductive layer 114 is within the interior insulation layer 128. The bottom side of the lower interior conductive layer 114 is coplanar with the bottom side of the interior insulation layer 128 and the lead top side 106. The interior insulation layer 128 can be formed with an insulation material including a dielectric.

Figure 5:
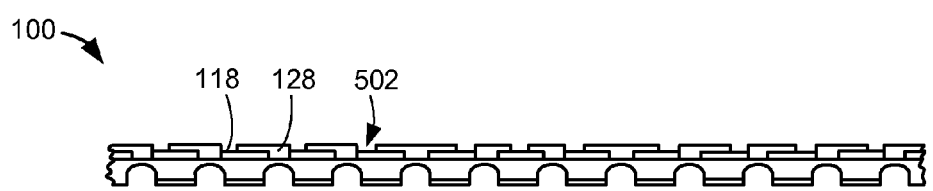
FIG. 5 is the structure of FIG. 4 in an insulation-removal phase.

Referring now to FIG. 5, therein is shown the structure of FIG. 4 in an insulation-removal phase. The interior insulation layer 128 can be partially and selectively removed to form holes 502 in the interior insulation layer 128. The holes 502 can be through the interior insulation layer 128 exposing a portion of the lower layer top side 118. For example, the holes 502 can represent vias.

Figure 6:
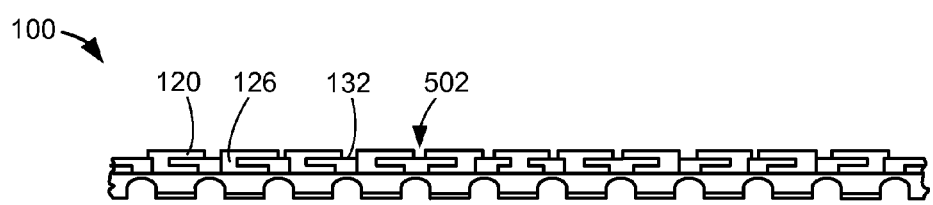
FIG. 6 is the structure of FIG. 5 in a conductor-formation phase.

Referring now to FIG. 6, therein is shown the structure of FIG. 5 in a conductor-formation phase. The holes 502 can be filled with an electrically conductive material, including a metal or a metallic alloy, to form the interior connection layer 126. The upper interior conductive layer 120 can be formed directly on the interior connection layer 126 and the interior insulation top side 132. The upper interior conductive layer 120 can be formed with an electrically conductive material including a metal or a metallic alloy.

Figure 7:
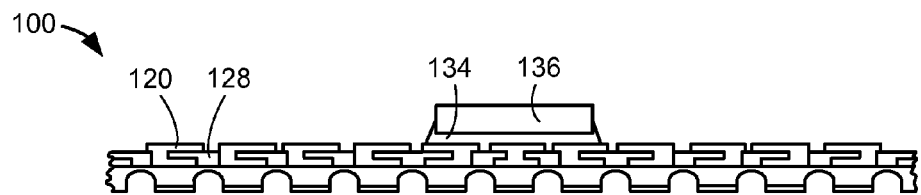
FIG. 7 is the structure of FIG. 6 in an attachment phase.

Referring now to FIG. 7, therein is shown the structure of FIG. 6 in an attachment phase. The integrated circuit packaging system 100 can include the attach layer 134 attached to the upper interior conductive layer 120, the interior insulation layer 128, and the integrated circuit 136. The integrated circuit 136 can be mounted over the upper interior conductive layer 120 with the attach layer 134.

For example, the attach layer 134 can include an attach material including a die attach film, an adhesive material, or a thermally conductive material. Also for example, the integrated circuit 136 can include a semiconductor device including a wirebond chip, a flip chip, or a silicon (Si) die.

Figure 8:
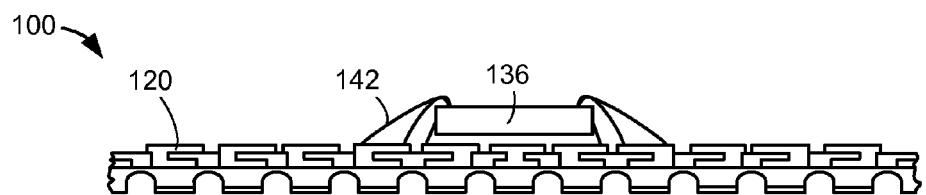
FIG. 8 is the structure of FIG. 7 in an internal connection phase.

Referring now to FIG. 8, therein is shown the structure of FIG. 7 in an internal connection phase. The integrated circuit packaging system 100 can include the internal connectors 142 attached to the integrated circuit 136 and the upper interior conductive layer 120. For example, the internal connectors 142 can represent electrically conductive connectors including bond wires or conductive bumps.

Figure 9:
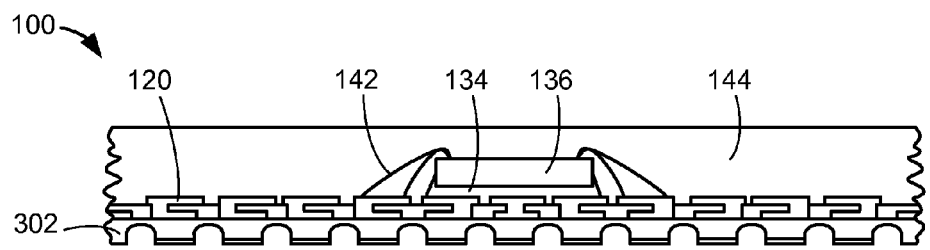
FIG. 9 is the structure of FIG. 8 in a molding phase.

Referring now to FIG. 9, therein is shown the structure of FIG. 8 in a molding phase. The integrated circuit packaging system 100 can include a molding process to form the encapsulation 144. The encapsulation 144 can be formed over the carrier 302, the upper interior conductive layer 120, the attach layer 134, the integrated circuit 136, and the internal connectors 142.

Figure 10:
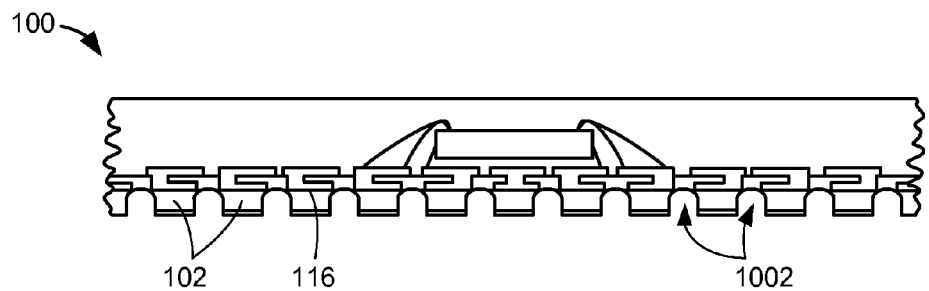
FIG. 10 is the structure of FIG. 9 in a carrier-removal phase.

Referring now to FIG. 10, therein is shown the structure of FIG. 9 in a carrier-removal phase. The integrated circuit packaging system 100 can include a removal process including bottom etching to partially remove portions of the carrier 302 of FIG. 3 to form carrier openings 1002.

A portion of the lower layer bottom side 116 can be exposed by the carrier openings 1002. The carrier 302 can be partially removed at the carrier recess portion 308 of FIG. 3 to form the carrier openings 1002. The leads 102 can be formed with the carrier 302 partially removed at the carrier bottom side 304. The lead top side 106 is wider than the lead bottom side 104.

Figure 11:
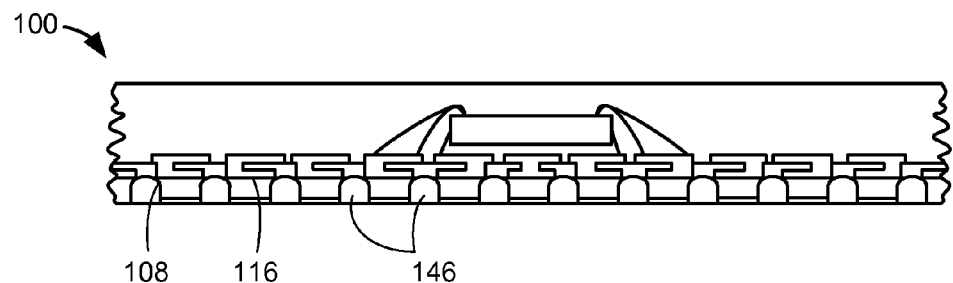
FIG. 11 is the structure of FIG. 10 in an insulation-formation phase.

Referring now to FIG. 11, therein is shown the structure of FIG. 10 in an insulation-formation phase. The integrated circuit packaging system 100 can include the protection layer 146 to provide protection to a portion of the lower layer bottom side 116 exposed by the carrier openings 1002 of FIG. 10.

The protection layer 146 can be formed with an insulation material including a passivation, a solder resist, an epoxy, or an adhesive. The protection layer 146 can be formed directly on the lead non-horizontal side 108 and a portion of the lower layer bottom side 116.

Figure 12:
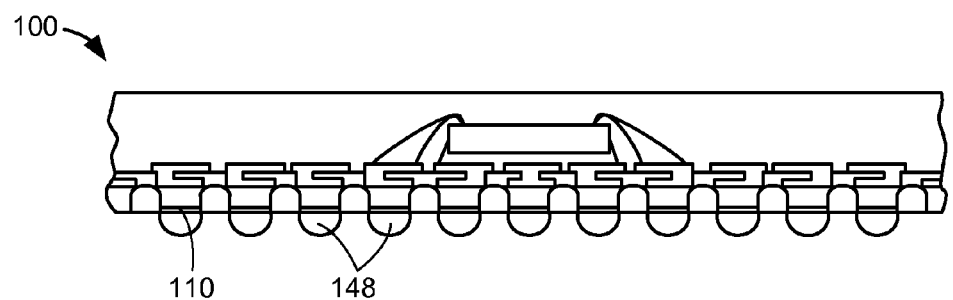
FIG. 12 is the structure of FIG. 11 in a bottom interconnection phase.

Referring now to FIG. 12, therein is shown the structure of FIG. 11 in a bottom interconnection phase. The integrated circuit packaging system 100 can optionally include the external connectors 148 attached to the exterior conductive layer 110. The external connectors 148 can be formed with a conductive material including solder, a metal, or a metallic alloy. The external connectors 148 can represent conductive connectors including solder balls.

In a subsequent phase, the integrated circuit packaging system 100 can include a package singulation process to produce individual units or packages of the integrated circuit packaging system 100. The package singulation process can include a mechanical or optical process.

Figure 13:
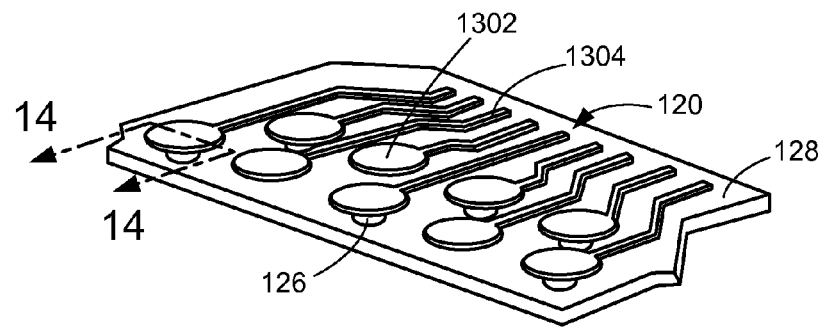
FIG. 13 is a top isometric plan view of a top portion of the multi-layer conductive structure of FIG. 1.

Referring now to FIG. 13, therein is shown a top isometric plan view of a top portion of the multi-layer conductive structure 112 of FIG. 1. The top isometric plan view depicts the interior insulation layer 128 and the interior connection layer 126 below the upper interior conductive layer 120.

The upper interior conductive layer 120 can include a number of upper contacts 1302, which are defined as terminals for electrical connectivity. The upper contacts 1302 can be attached to the internal connectors 142 of FIG. 1. The upper interior conductive layer 120 can include a number of upper traces 1304, which are defined as conductive connectors for providing electrical connectivity for electrical signals or potential levels. The upper interior conductive layer 120 can represent a conductive structure including additive routable conductive traces or extensions.

For illustration purposes, the upper interior conductive layer 120 is shown having an array of two of the upper contacts 1302 along a perimeter side of the interior insulation layer 128, although it is understood that the upper interior conductive layer 120 can be formed with an array of any number of the upper contacts 1302. For example, the upper interior conductive layer 120 can be formed with an array of three of the upper contacts 1302.

Figure 14:
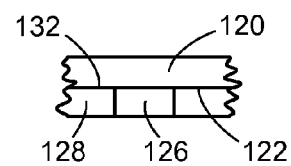
FIG. 14 is a cross-sectional view taken along line 14-14 of FIG. 13.

Referring now to FIG. 14, therein is shown a cross-sectional view taken along line 14-14 of FIG. 13. The interior connection layer 126 and the upper interior conductive layer 120 can be formed with a single integral structure having a common conductive material. The interior connection layer 126 can be formed through the interior insulation layer 128 with the upper layer bottom side 122 directly on the interior connection layer 126 and the interior insulation top side 132. The upper layer bottom side 122, the interior insulation top side 132, a top extent of the interior connection layer 126 can be coplanar with each other.

Figure 15:
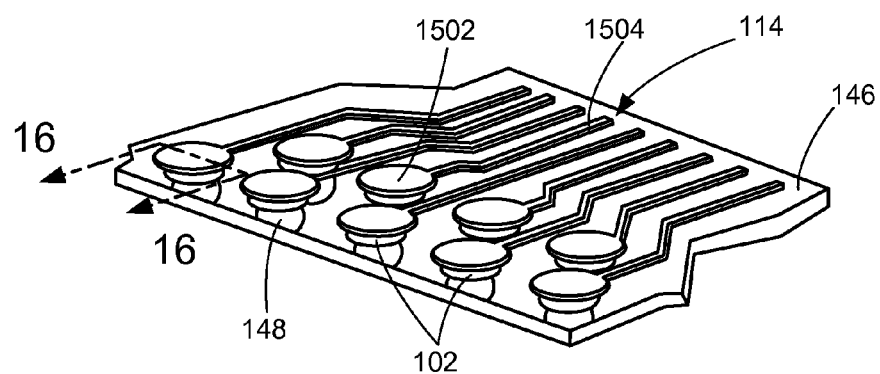
FIG. 15 is a top isometric plan view of another portion of the multi-layer conductive structure of FIG. 1.

Referring now to FIG. 15, therein is shown a top isometric plan view of another portion of the multi-layer conductive structure 112 of FIG. 1. The top isometric plan view depicts the protection layer 146 and the leads 102 below the lower interior conductive layer 114. The external connectors 148 can be attached to the leads 102.

The lower interior conductive layer 114 can include a number of lower contacts 1502, which are defined as terminals for electrical connectivity. Each of the lower contacts 1502 can be attached to the interior connection layer 126 of FIG. 1. The lower interior conductive layer 114 can include a number of lower traces 1504, which are defined as conductive connectors for providing electrical connectivity for electrical signals or potential levels. The lower interior conductive layer 114 can represent a conductive structure including additive routable conductive traces or extensions.

For illustration purposes, the lower interior conductive layer 114 is shown having an array of two of the lower contacts 1502 along a perimeter side of the protection layer 146, although it is understood that the lower interior conductive layer 114 can be formed with an array of any number of the lower contacts 1502. For example, the lower interior conductive layer 114 can be formed with an array of three of the lower contacts 1502.

Figure 16:
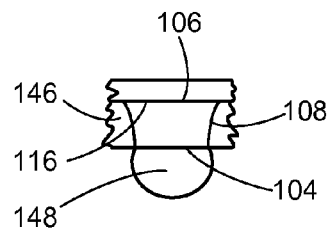
FIG. 16 is a cross-sectional view taken along line 16-16 of FIG. 15.

Referring now to FIG. 16, therein is shown a cross-sectional view taken along line 16-16 of FIG. 15. The protection layer 146 can be formed directly on the lead non-horizontal side 108 and the lower layer bottom side 116. The lead top side 106, the lower layer bottom side 116, and a top extent of the protection layer 146 can be coplanar with each other. One of the external connectors 148 can be attached to the lead bottom side 104. The lead non-horizontal side 108 can be formed with a curved surface including concave.

Figure 17:
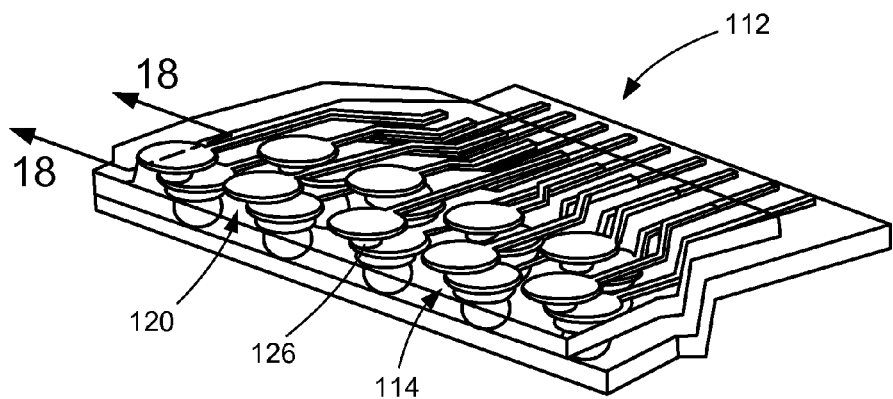
FIG. 17 is a top isometric plan view of the multi-layer conductive structure.

Referring now to FIG. 17, therein is shown a top isometric plan view of the multi-layer conductive structure 112. The top isometric plan view depicts a stack of a structure of FIG. 13 over a structure of FIG. 15. The upper interior conductive layer 120 can be electrically connected to the lower interior conductive layer 114 with the interior connection layer 126.

Figure 18:
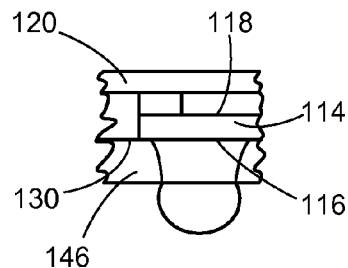
FIG. 18 is a cross-sectional view taken along line 18-18 of FIG. 17.

Referring now to FIG. 18, therein is shown a cross-sectional view taken along line 18-18 of FIG. 17. The lower interior conductive layer 114 can be stacked over the upper interior conductive layer 120. The protection layer 146 can be formed covering the lower layer top side 118. A top extent of the protection layer 146 can be formed directly on portions of the interior insulation bottom side 130 and the lower layer bottom side 116.

Figure 19:
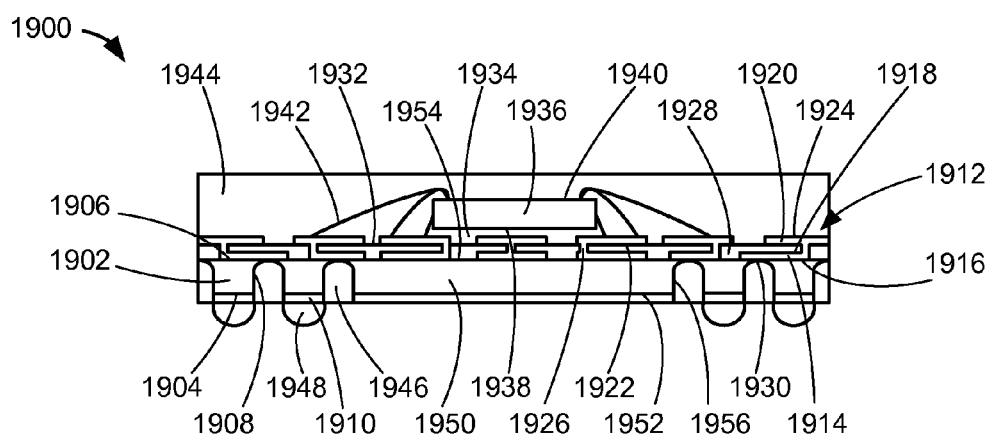
FIG. 19 is a cross-sectional view of an integrated circuit packaging system in a second embodiment of the present invention.

Referring now to FIG. 19, therein is shown a cross-sectional view of an integrated circuit packaging system 1900 in a second embodiment of the present invention. In a manner similar to the integrated circuit packaging system 100, the integrated circuit packaging system 1900 includes leads 1902, each having a lead bottom side 1904, a lead top side 1906, and a lead non-horizontal side 1908. In a manner similar to the integrated circuit packaging system 100, the integrated circuit packaging system 1900 includes an exterior conductive layer 1910.

In a manner similar to the integrated circuit packaging system 100, the integrated circuit packaging system 1900 includes a multi-layer conductive structure 1912 having a lower interior conductive layer 1914 with a lower layer bottom side 1916 and a lower layer top side 1918. In a manner similar to the integrated circuit packaging system 100, the integrated circuit packaging system 1900 includes the multi-layer conductive structure 1912 having an upper interior conductive layer 1920 with an upper layer bottom side 1922 and an upper layer top side 1924.

In a manner similar to the integrated circuit packaging system 100, the integrated circuit packaging system 1900 includes the multi-layer conductive structure 1912 having an interior connection layer 1926. In a manner similar to the integrated circuit packaging system 100, the integrated circuit packaging system 1900 includes the multi-layer conductive structure 1912 having an interior insulation layer 1928 with an interior insulation bottom side 1930 and an interior insulation top side 1932.

In a manner similar to the integrated circuit packaging system 100, the integrated circuit packaging system 1900 includes an attach layer 1934. In a manner similar to the integrated circuit packaging system 100, the integrated circuit packaging system 1900 includes an integrated circuit 1936 with an inactive side 1938 and an active side 1940. In a manner similar to the integrated circuit packaging system 100, the integrated circuit packaging system 1900 includes internal connectors 1942, an encapsulation 1944, a protection layer 1946, and external connectors 1948.

The integrated circuit packaging system 1900 can include a package paddle 1950, which is defined as a support structure for mounting and attaching a semiconductor device. The package paddle 1950 can include a paddle bottom side 1952 and a paddle top side 1954 opposite the paddle bottom side 1952. The package paddle 1950 can include a paddle non-horizontal side 1956, which is defined as a lateral side that defines a horizontal boundary of the package paddle 1950. The paddle non-horizontal side 1956 extends from the paddle bottom side 1952 to the paddle top side 1954. The paddle non-horizontal side 1956 can include a curved surface.

The lower layer bottom side 1916 can be formed directly on the paddle top side 1954. The integrated circuit 1936 can be mounted directly over the paddle top side 1954. The paddle non-horizontal side 1956 can be completely horizontally surrounded by the leads 1902. The exterior conductive layer 1910 can be formed directly on the paddle bottom side 1952. The protection layer 1946 can be formed directly on the paddle non-horizontal side 1956. A top extent of the protection layer 1946 can be coplanar with the paddle top side 1954.

It has been discovered that the multi-layer conductive structure 1912 provides improved reliability with the upper interior conductive layer 1920 and the lower interior conductive layer 1914 directly on the lead top side 1906 providing increased spacing for routability thereby providing reduced wire span and eliminating electrical shorts between traces.

It has also been discovered that the protection layer 1946 provides improved reliability with a bottom extent of the protection layer 1946 coplanar with a bottom extent of the exterior conductive layer 1910 and with the lead non-horizontal side 1908 and the paddle non-horizontal side 1956 covered by the protection layer 1946 to provide terminal interlocking resulting in elimination of lead pullouts.

It has further been discovered that the upper interior conductive layer 1920 electrically connected to the leads 1902 and the integrated circuit 1936 provides improved reliability by reducing wire span of the internal connectors 1942.

Figure 20:
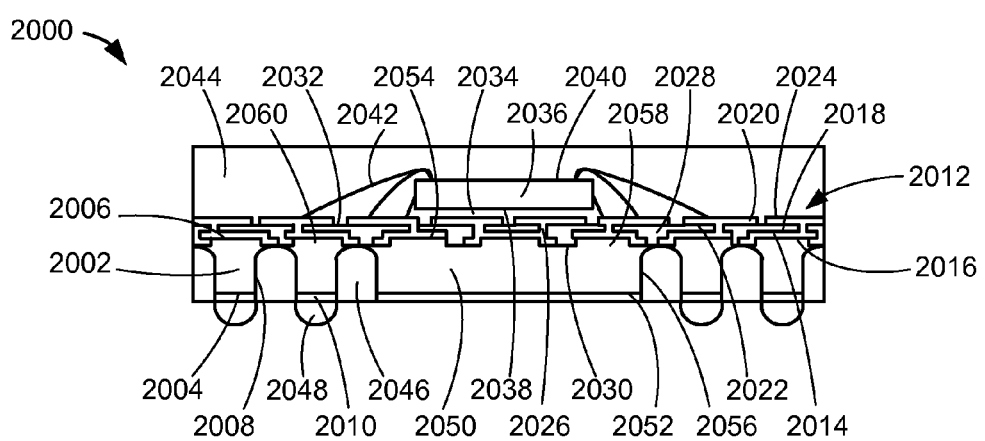
FIG. 20 is a cross-sectional view of an integrated circuit packaging system in a third embodiment of the present invention.

Referring now to FIG. 20, therein is shown a cross-sectional view of an integrated circuit packaging system 2000 in a third embodiment of the present invention. In a manner similar to the integrated circuit packaging system 100, the integrated circuit packaging system 2000 includes leads 2002, each having a lead bottom side 2004, a lead top side 2006, and a lead non-horizontal side 2008. In a manner similar to the integrated circuit packaging system 100, the integrated circuit packaging system 2000 includes an exterior conductive layer 2010.

In a manner similar to the integrated circuit packaging system 100, the integrated circuit packaging system 2000 includes a multi-layer conductive structure 2012 having a lower interior conductive layer 2014 with a lower layer bottom side 2016 and a lower layer top side 2018. In a manner similar to the integrated circuit packaging system 100, the integrated circuit packaging system 2000 includes the multi-layer conductive structure 2012 having an upper interior conductive layer 2020 with an upper layer bottom side 2022 and an upper layer top side 2024.

In a manner similar to the integrated circuit packaging system 100, the integrated circuit packaging system 2000 includes the multi-layer conductive structure 2012 having an interior connection layer 2026. In a manner similar to the integrated circuit packaging system 100, the integrated circuit packaging system 2000 includes the multi-layer conductive structure 2012 having an interior insulation layer 2028 with an interior insulation bottom side 2030 and an interior insulation top side 2032.

In a manner similar to the integrated circuit packaging system 100, the integrated circuit packaging system 2000 includes an attach layer 2034. In a manner similar to the integrated circuit packaging system 100, the integrated circuit packaging system 2000 includes an integrated circuit 2036 with an inactive side 2038 and an active side 2040. In a manner similar to the integrated circuit packaging system 100, the integrated circuit packaging system 2000 includes internal connectors 2042, an encapsulation 2044, a protection layer 2046, and external connectors 2048.

The integrated circuit packaging system 2000 can include a package paddle 2050, which is defined as a support structure for mounting and attaching a semiconductor device. The package paddle 2050 can include a paddle bottom side 2052 and a paddle top side 2054 opposite the paddle bottom side 2052. The package paddle 2050 can include a paddle non-horizontal side 2056, which is defined as a lateral side that defines a horizontal boundary of the package paddle 2050. The paddle non-horizontal side 2056 extends from the paddle bottom side 2052 to the paddle top side 2054. The paddle non-horizontal side 2056 can include a curved surface.

The package paddle 2050 can include paddle step portions 2058, which is defined as a portion of the package paddle 2050 that vertically extends from the paddle top side 2054. Each of the leads 2002 can include a lead step portion 2060, which is defined as a portion of each of the leads 2002 that vertically extends from the lead top side 2006. The lower layer bottom side 2016 can be formed directly on top extents of the paddle step portions 2058, non-horizontal sides of the paddle step portions 2058, a top extent of the lead step portion 2060, and a non-horizontal side of the lead step portion 2060.

The integrated circuit 2036 can be mounted directly over the paddle top side 2054 and top extents of the paddle step portions 2058. The paddle non-horizontal side 2056 can be completely horizontally surrounded by the leads 2002. The exterior conductive layer 2010 can be formed directly on the paddle bottom side 2052. The protection layer 2046 can be formed directly on the paddle non-horizontal side 2056. A top extent of the protection layer 2046 can be coplanar with the paddle top side 2054.

It has been discovered that the multi-layer conductive structure 2012 provides improved reliability with the upper interior conductive layer 2020 and the lower interior conductive layer 2014 directly on the lead top side 2006 providing increased spacing for routability thereby providing reduced wire span and eliminating electrical shorts between traces.

It has also been discovered that the protection layer 2046 provides improved reliability with a bottom extent of the protection layer 2046 coplanar with a bottom extent of the exterior conductive layer 2010 and with the lead non-horizontal side 2008 and the paddle non-horizontal side 2056 covered by the protection layer 2046 to provide terminal interlocking resulting in elimination of lead pullouts.

It has further been discovered that the upper interior conductive layer 2020 electrically connected to the leads 2002 and the integrated circuit 2036 provides improved reliability by reducing wire span of the internal connectors 2042.

It has further been discovered that the paddle step portions 2058 and the lead step portion 2060 provide improved reliability by providing increased surface area for the lower interior conductive layer 2014 to form directly thereon for improved interlock thereby eliminating pullout of the package paddle 2050 and the leads 2002.

Figure 21:
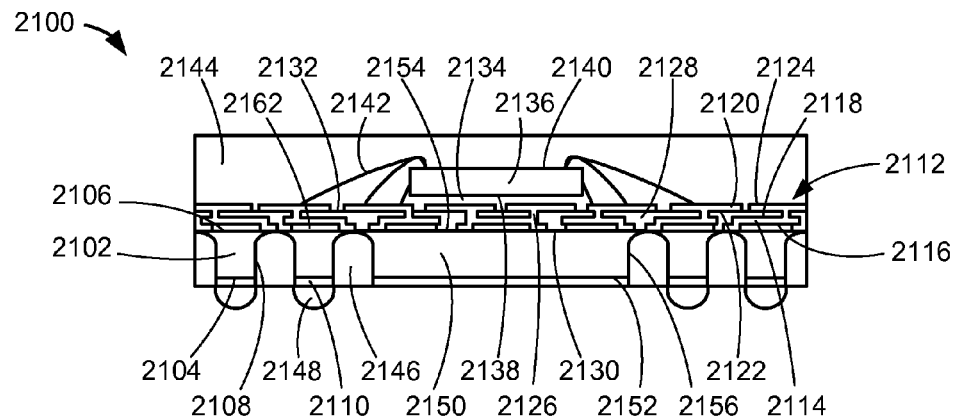
FIG. 21 is a cross-sectional view of an integrated circuit packaging system in a fourth embodiment of the present invention.

Referring now to FIG. 21, therein is shown a cross-sectional view of an integrated circuit packaging system 2100 in a fourth embodiment of the present invention. In a manner similar to the integrated circuit packaging system 100, the integrated circuit packaging system 2100 includes leads 2102, each having a lead bottom side 2104, a lead top side 2106, and a lead non-horizontal side 2108. In a manner similar to the integrated circuit packaging system 100, the integrated circuit packaging system 2100 includes an exterior conductive layer 2110.

In a manner similar to the integrated circuit packaging system 100, the integrated circuit packaging system 2100 includes a multi-layer conductive structure 2112 having a lower interior conductive layer 2114 with a lower layer bottom side 2116 and a lower layer top side 2118. In a manner similar to the integrated circuit packaging system 100, the integrated circuit packaging system 2100 includes the multi-layer conductive structure 2112 having an upper interior conductive layer 2120 with an upper layer bottom side 2122 and an upper layer top side 2124.

In a manner similar to the integrated circuit packaging system 100, the integrated circuit packaging system 2100 includes the multi-layer conductive structure 2112 having an interior connection layer 2126. In a manner similar to the integrated circuit packaging system 100, the integrated circuit packaging system 2100 includes the multi-layer conductive structure 2112 having an interior insulation layer 2128 with an interior insulation bottom side 2130 and an interior insulation top side 2132.

In a manner similar to the integrated circuit packaging system 100, the integrated circuit packaging system 2100 includes an attach layer 2134. In a manner similar to the integrated circuit packaging system 100, the integrated circuit packaging system 2100 includes an integrated circuit 2136 with an inactive side 2138 and an active side 2140. In a manner similar to the integrated circuit packaging system 100, the integrated circuit packaging system 2100 includes internal connectors 2142, an encapsulation 2144, a protection layer 2146, and external connectors 2148.

The integrated circuit packaging system 2100 can include a package paddle 2150, which is defined as a support structure for mounting and attaching a semiconductor device. The package paddle 2150 can include a paddle bottom side 2152 and a paddle top side 2154 opposite the paddle bottom side 2152. The package paddle 2150 can include a paddle non-horizontal side 2156, which is defined as a lateral side that defines a horizontal boundary of the package paddle 2150. The paddle non-horizontal side 2156 extends from the paddle bottom side 2152 to the paddle top side 2154. The paddle non-horizontal side 2156 can include a curved surface.

The integrated circuit packaging system 2100 can include conductive caps 2162, which are defined as layers of an electrically conductive material. The conductive caps 2162 can be formed directly on the lead top side 2106 and the paddle top side 2154. The lower layer bottom side 2116 can be formed directly on top extents of the conductive caps 2162 and non-horizontal sides of the conductive caps 2162.

The integrated circuit 2136 can be mounted directly over the paddle top side 2154 and top extents of the conductive caps 2162. The paddle non-horizontal side 2156 can be completely horizontally surrounded by the leads 2102. The exterior conductive layer 2110 can be formed directly on the paddle bottom side 2152. The protection layer 2146 can be formed directly on the paddle non-horizontal side 2156. A top extent of the protection layer 2146 can be coplanar with the paddle top side 2154.

It has been discovered that the multi-layer conductive structure 2112 provides improved reliability with the upper interior conductive layer 2120 and the lower interior conductive layer 2114 directly on the lead top side 2106 providing increased spacing for routability thereby providing reduced wire span and eliminating electrical shorts between traces.

It has also been discovered that the protection layer 2146 provides improved reliability with a bottom extent of the protection layer 2146 coplanar with a bottom extent of the exterior conductive layer 2110 and with the lead non-horizontal side 2108 and the paddle non-horizontal side 2156 covered by the protection layer 2146 to provide terminal interlocking resulting in elimination of lead pullouts.

It has further been discovered that the upper interior conductive layer 2120 electrically connected to the leads 2102 and the integrated circuit 2136 provides improved reliability by reducing wire span of the internal connectors 2142.

It has further been discovered that the conductive caps 2162 provide improved reliability by providing increased surface area for the lower interior conductive layer 2114 to form directly thereon for improved interlock thereby eliminating pullout of the package paddle 2150 and the leads 2102.

Figure 22:
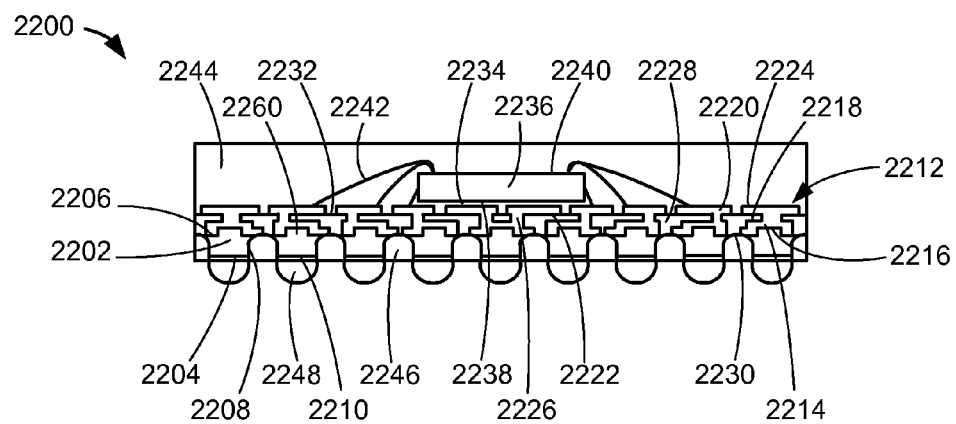
FIG. 22 is a cross-sectional view of an integrated circuit packaging system in a fifth embodiment of the present invention.

Referring now to FIG. 22, therein is shown a cross-sectional view of an integrated circuit packaging system 2200 in a fifth embodiment of the present invention. In a manner similar to the integrated circuit packaging system 100, the integrated circuit packaging system 2200 includes leads 2202, each having a lead bottom side 2204, a lead top side 2206, and a lead non-horizontal side 2208. In a manner similar to the integrated circuit packaging system 100, the integrated circuit packaging system 2200 includes an exterior conductive layer 2210.

In a manner similar to the integrated circuit packaging system 100, the integrated circuit packaging system 2200 includes a multi-layer conductive structure 2212 having a lower interior conductive layer 2214 with a lower layer bottom side 2216 and a lower layer top side 2218. In a manner similar to the integrated circuit packaging system 100, the integrated circuit packaging system 2200 includes the multi-layer conductive structure 2212 having an upper interior conductive layer 2220 with an upper layer bottom side 2222 and an upper layer top side 2224.

In a manner similar to the integrated circuit packaging system 100, the integrated circuit packaging system 2200 includes the multi-layer conductive structure 2212 having an interior connection layer 2226. In a manner similar to the integrated circuit packaging system 100, the integrated circuit packaging system 2200 includes the multi-layer conductive structure 2212 having an interior insulation layer 2228 with an interior insulation bottom side 2230 and an interior insulation top side 2232.

In a manner similar to the integrated circuit packaging system 100, the integrated circuit packaging system 2200 includes an attach layer 2234. In a manner similar to the integrated circuit packaging system 100, the integrated circuit packaging system 2200 includes an integrated circuit 2236 with an inactive side 2238 and an active side 2240. In a manner similar to the integrated circuit packaging system 100, the integrated circuit packaging system 2200 includes internal connectors 2242, an encapsulation 2244, a protection layer 2246, and external connectors 2248.

Each of the leads 2202 can include a lead step portion 2260, which is defined as a portion of each of the leads 2202 that vertically extends from the lead top side 2206. The lower layer bottom side 2216 can be formed directly on a top extent of the lead step portion 2260 and a non-horizontal side of the lead step portion 2260. The integrated circuit 2236 can be mounted directly over the lead step portion 2260 of each of a number of the leads 2202.

It has been discovered that the multi-layer conductive structure 2212 provides improved reliability with the upper interior conductive layer 2220 and the lower interior conductive layer 2214 directly on the lead top side 2206 providing increased spacing for routability thereby providing reduced wire span and eliminating electrical shorts between traces.

It has also been discovered that the protection layer 2246 provides improved reliability with a bottom extent of the protection layer 2246 coplanar with a bottom extent of the exterior conductive layer 2210 and with the lead non-horizontal side 2208 covered by the protection layer 2246 to provide terminal interlocking resulting in elimination of lead pullouts.

It has further been discovered that the upper interior conductive layer 2220 electrically connected to the leads 2202 and the integrated circuit 2236 provides improved reliability by reducing wire span of the internal connectors 2242.

It has further been discovered that the lead step portion 2260 provide improved reliability by providing increased surface area for the lower interior conductive layer 2214 to form directly thereon for improved interlock thereby eliminating pullout of the leads 2202.

Figure 23:
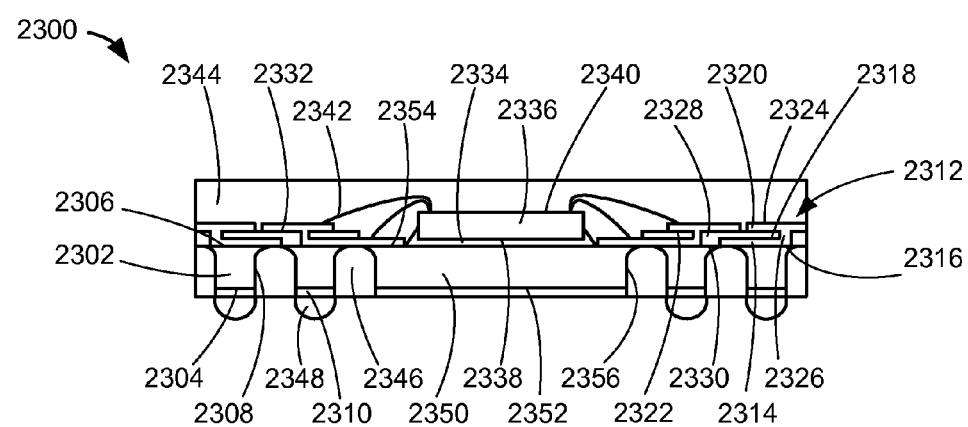
FIG. 23 is a cross-sectional view of an integrated circuit packaging system in a sixth embodiment of the present invention.

Referring now to FIG. 23, therein is shown a cross-sectional view of an integrated circuit packaging system 2300 in a sixth embodiment of the present invention. In a manner similar to the integrated circuit packaging system 100, the integrated circuit packaging system 2300 includes leads 2302, each having a lead bottom side 2304, a lead top side 2306, and a lead non-horizontal side 2308. In a manner similar to the integrated circuit packaging system 100, the integrated circuit packaging system 2300 includes an exterior conductive layer 2310.

In a manner similar to the integrated circuit packaging system 100, the integrated circuit packaging system 2300 includes a multi-layer conductive structure 2312 having a lower interior conductive layer 2314 with a lower layer bottom side 2316 and a lower layer top side 2318. In a manner similar to the integrated circuit packaging system 100, the integrated circuit packaging system 2300 includes the multi-layer conductive structure 2312 having an upper interior conductive layer 2320 with an upper layer bottom side 2322 and an upper layer top side 2324.

In a manner similar to the integrated circuit packaging system 100, the integrated circuit packaging system 2300 includes the multi-layer conductive structure 2312 having an interior connection layer 2326. In a manner similar to the integrated circuit packaging system 100, the integrated circuit packaging system 2300 includes the multi-layer conductive structure 2312 having an interior insulation layer 2328 with an interior insulation bottom side 2330 and an interior insulation top side 2332.

In a manner similar to the integrated circuit packaging system 100, the integrated circuit packaging system 2300 includes an attach layer 2334. In a manner similar to the integrated circuit packaging system 100, the integrated circuit packaging system 2300 includes an integrated circuit 2336 with an inactive side 2338 and an active side 2340. In a manner similar to the integrated circuit packaging system 100, the integrated circuit packaging system 2300 includes internal connectors 2342, an encapsulation 2344, a protection layer 2346, and external connectors 2348.

The integrated circuit packaging system 2300 can include a package paddle 2350, which is defined as a support structure for mounting and attaching a semiconductor device. The package paddle 2350 can include a paddle bottom side 2352 and a paddle top side 2354 opposite the paddle bottom side 2352. The package paddle 2350 can include a paddle non-horizontal side 2356, which is defined as a lateral side that defines a horizontal boundary of the package paddle 2350. The paddle non-horizontal side 2356 extends from the paddle bottom side 2352 to the paddle top side 2354. The paddle non-horizontal side 2356 can include a curved surface.

A portion of the lower layer bottom side 2316 can be formed directly on the lead top side 2306 of one of the leads 2302 and the paddle top side 2354. The paddle non-horizontal side 2356 can be completely horizontally surrounded by the leads 2302. The exterior conductive layer 2310 can be formed directly on the paddle bottom side 2352. The protection layer 2346 can be formed directly on the paddle non-horizontal side 2356. A top extent of the protection layer 2346 can be coplanar with the paddle top side 2354.

The integrated circuit 2336 can be mounted directly over the package paddle 2350 with the attach layer 2334 attached to the inactive side 2338 and the paddle top side 2354. One of the internal connectors 2342 can be attached to the active side 2340 and a portion of the lower layer top side 2318 that is exposed from the interior insulation layer 2328.

It has been discovered that the multi-layer conductive structure 2312 provides improved reliability with the upper interior conductive layer 2320 and the lower interior conductive layer 2314 directly on the lead top side 2306 providing increased spacing for routability thereby providing reduced wire span and eliminating electrical shorts between traces.

It has also been discovered that the protection layer 2346 provides improved reliability with a bottom extent of the protection layer 2346 coplanar with a bottom extent of the exterior conductive layer 2310 and with the lead non-horizontal side 2308 and the paddle non-horizontal side 2356 covered by the protection layer 2346 to provide terminal interlocking resulting in elimination of lead pullouts.

It has further been discovered that the upper interior conductive layer 2320 electrically connected to the leads 2302 and the integrated circuit 2336 provides improved reliability by reducing wire span of the internal connectors 2342.

It has further been discovered that the attach layer 2334 attached to the inactive side 2338 and the paddle top side 2354 provides reduced vertical height of the integrated circuit packaging system 2300.

It has further been discovered that a portion of the lower layer top side 2318 exposed from the interior insulation layer 2328 provides improved reliability by eliminating wire shorts with reduced wire span when the internal connectors 2342 are attach to the active side 2340 and the portion of the lower layer top side 2318 that is closest to the integrated circuit 2336.

Figure 24:
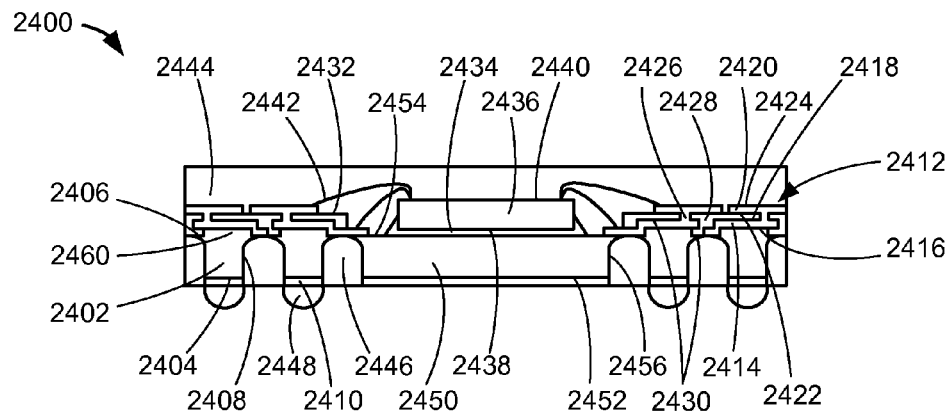
FIG. 24 is a cross-sectional view of an integrated circuit packaging system in a seventh embodiment of the present invention.

Referring now to FIG. 24, therein is shown a cross-sectional view of an integrated circuit packaging system 2400 in a seventh embodiment of the present invention. In a manner similar to the integrated circuit packaging system 100, the integrated circuit packaging system 2400 includes leads 2402, each having a lead bottom side 2404, a lead top side 2406, and a lead non-horizontal side 2408. In a manner similar to the integrated circuit packaging system 100, the integrated circuit packaging system 2400 includes an exterior conductive layer 2410.

In a manner similar to the integrated circuit packaging system 100, the integrated circuit packaging system 2400 includes a multi-layer conductive structure 2412 having a lower interior conductive layer 2414 with a lower layer bottom side 2416 and a lower layer top side 2418. In a manner similar to the integrated circuit packaging system 100, the integrated circuit packaging system 2400 includes the multi-layer conductive structure 2412 having an upper interior conductive layer 2420 with an upper layer bottom side 2422 and an upper layer top side 2424.

In a manner similar to the integrated circuit packaging system 100, the integrated circuit packaging system 2400 includes the multi-layer conductive structure 2412 having an interior connection layer 2426. In a manner similar to the integrated circuit packaging system 100, the integrated circuit packaging system 2400 includes the multi-layer conductive structure 2412 having an interior insulation layer 2428 with an interior insulation bottom side 2430 and an interior insulation top side 2432.

In a manner similar to the integrated circuit packaging system 100, the integrated circuit packaging system 2400 includes an attach layer 2434. In a manner similar to the integrated circuit packaging system 100, the integrated circuit packaging system 2400 includes an integrated circuit 2436 with an inactive side 2438 and an active side 2440. In a manner similar to the integrated circuit packaging system 100, the integrated circuit packaging system 2400 includes internal connectors 2442, an encapsulation 2444, a protection layer 2446, and external connectors 2448.

The integrated circuit packaging system 2400 can include a package paddle 2450, which is defined as a support structure for mounting and attaching a semiconductor device. The package paddle 2450 can include a paddle bottom side 2452 and a paddle top side 2454 opposite the paddle bottom side 2452. The package paddle 2450 can include a paddle non-horizontal side 2456, which is defined as a lateral side that defines a horizontal boundary of the package paddle 2450. The paddle non-horizontal side 2456 extends from the paddle bottom side 2452 to the paddle top side 2454. The paddle non-horizontal side 2456 can include a curved surface.

Each of the leads 2402 can include a lead step portion 2460, which is defined as a portion of each of the leads 2402 that vertically extends from the lead top side 2406. The lower layer bottom side 2416 can be formed directly on a top extent of the lead step portion 2460 and a non-horizontal side of the lead step portion 2460.

A portion of the lower layer bottom side 2416 can be formed directly on the lead top side 2406 of one of the leads 2402 and the paddle top side 2454. The paddle non-horizontal side 2456 can be completely horizontally surrounded by the leads 2402. The exterior conductive layer 2410 can be formed directly on the paddle bottom side 2452. The protection layer 2446 can be formed directly on the paddle non-horizontal side 2456. A top extent of the protection layer 2446 can be coplanar with the paddle top side 2454.

The integrated circuit 2436 can be mounted directly over the package paddle 2450 with the attach layer 2434 attached to the inactive side 2438 and the paddle top side 2454. One of the internal connectors 2442 can be attached to the active side 2440 and a portion of the lower layer top side 2418 that is exposed from the interior insulation layer 2428.

It has been discovered that the multi-layer conductive structure 2412 provides improved reliability with the upper interior conductive layer 2420 and the lower interior conductive layer 2414 directly on the lead top side 2406 providing increased spacing for routability thereby providing reduced wire span and eliminating electrical shorts between traces.

It has also been discovered that the protection layer 2446 provides improved reliability with a bottom extent of the protection layer 2446 coplanar with a bottom extent of the exterior conductive layer 2410 and with the lead non-horizontal side 2408 and the paddle non-horizontal side 2456 covered by the protection layer 2446 to provide terminal interlocking resulting in elimination of lead pullouts.

It has further been discovered that the upper interior conductive layer 2420 electrically connected to the leads 2402 and the integrated circuit 2436 provides improved reliability by reducing wire span of the internal connectors 2442.

It has further been discovered that the lead step portion 2460 provide improved reliability by providing increased surface area for the lower interior conductive layer 2414 to form directly thereon for improved interlock thereby eliminating pullout of the leads 2402.

It has further been discovered that the attach layer 2434 attached to the inactive side 2438 and the paddle top side 2454 provides reduced vertical height of the integrated circuit packaging system 2400.

It has further been discovered that a portion of the lower layer top side 2418 exposed from the interior insulation layer 2428 provides improved reliability by eliminating wire shorts with reduced wire span when the internal connectors 2442 are attach to the active side 2440 and the portion of the lower layer top side 2418 that is closest to the integrated circuit 2436.

Figure 25:
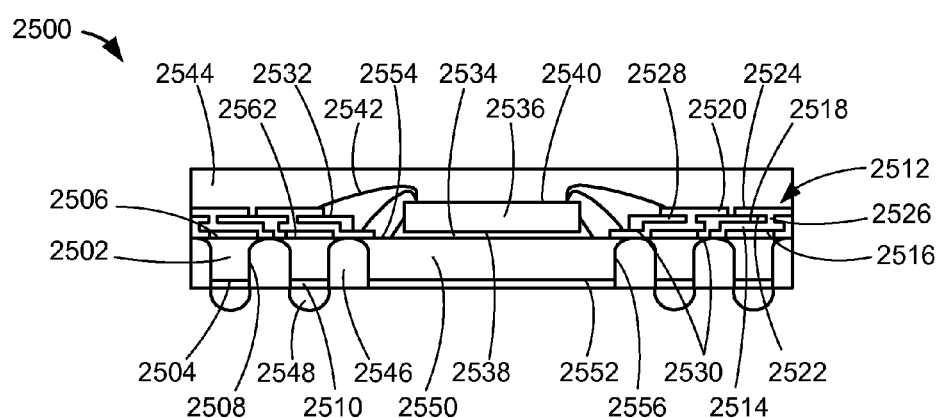
FIG. 25 is a cross-sectional view of an integrated circuit packaging system in an eighth embodiment of the present invention.

Referring now to FIG. 25, therein is shown a cross-sectional view of an integrated circuit packaging system 2500 in an eighth embodiment of the present invention. In a manner similar to the integrated circuit packaging system 100, the integrated circuit packaging system 2500 includes leads 2502, each having a lead bottom side 2504, a lead top side 2506, and a lead non-horizontal side 2508. In a manner similar to the integrated circuit packaging system 100, the integrated circuit packaging system 2500 includes an exterior conductive layer 2510.

In a manner similar to the integrated circuit packaging system 100, the integrated circuit packaging system 2500 includes a multi-layer conductive structure 2512 having a lower interior conductive layer 2514 with a lower layer bottom side 2516 and a lower layer top side 2518. In a manner similar to the integrated circuit packaging system 100, the integrated circuit packaging system 2500 includes the multi-layer conductive structure 2512 having an upper interior conductive layer 2520 with an upper layer bottom side 2522 and an upper layer top side 2524.

In a manner similar to the integrated circuit packaging system 100, the integrated circuit packaging system 2500 includes the multi-layer conductive structure 2512 having an interior connection layer 2526. In a manner similar to the integrated circuit packaging system 100, the integrated circuit packaging system 2500 includes the multi-layer conductive structure 2512 having an interior insulation layer 2528 with an interior insulation bottom side 2530 and an interior insulation top side 2532.

In a manner similar to the integrated circuit packaging system 100, the integrated circuit packaging system 2500 includes an attach layer 2534. In a manner similar to the integrated circuit packaging system 100, the integrated circuit packaging system 2500 includes an integrated circuit 2536 with an inactive side 2538 and an active side 2540. In a manner similar to the integrated circuit packaging system 100, the integrated circuit packaging system 2500 includes internal connectors 2542, an encapsulation 2544, a protection layer 2546, and external connectors 2548.

The integrated circuit packaging system 2500 can include a package paddle 2550, which is defined as a support structure for mounting and attaching a semiconductor device. The package paddle 2550 can include a paddle bottom side 2552 and a paddle top side 2554 opposite the paddle bottom side 2552. The package paddle 2550 can include a paddle non-horizontal side 2556, which is defined as a lateral side that defines a horizontal boundary of the package paddle 2550. The paddle non-horizontal side 2556 extends from the paddle bottom side 2552 to the paddle top side 2554. The paddle non-horizontal side 2556 can include a curved surface.

The integrated circuit packaging system 2500 can include conductive caps 2562, which are defined as layers of an electrically conductive material. The conductive caps 2562 can be formed directly on the lead top side 2506. The lower layer bottom side 2516 can be formed directly on top extents of the conductive caps 2562 and non-horizontal sides of the conductive caps 2562.

A portion of the lower layer bottom side 2516 can be formed directly on the lead top side 2506 of one of the leads 2502 and the paddle top side 2554. The paddle non-horizontal side 2556 can be completely horizontally surrounded by the leads 2502. The exterior conductive layer 2510 can be formed directly on the paddle bottom side 2552. The protection layer 2546 can be formed directly on the paddle non-horizontal side 2556. A top extent of the protection layer 2546 can be coplanar with the paddle top side 2554.

The integrated circuit 2536 can be mounted directly over the package paddle 2550 with the attach layer 2534 attached to the inactive side 2538 and the paddle top side 2554. One of the internal connectors 2542 can be attached to the active side 2540 and a portion of the lower layer top side 2518 that is exposed from the interior insulation layer 2528.

It has been discovered that the multi-layer conductive structure 2512 provides improved reliability with the upper interior conductive layer 2520 and the lower interior conductive layer 2514 directly on the lead top side 2506 providing increased spacing for routability thereby providing reduced wire span and eliminating electrical shorts between traces.

It has also been discovered that the protection layer 2546 provides improved reliability with a bottom extent of the protection layer 2546 coplanar with a bottom extent of the exterior conductive layer 2510 and with the lead non-horizontal side 2508 and the paddle non-horizontal side 2556 covered by the protection layer 2546 to provide terminal interlocking resulting in elimination of lead pullouts.

It has further been discovered that the upper interior conductive layer 2520 electrically connected to the leads 2502 and the integrated circuit 2536 provides improved reliability by reducing wire span of the internal connectors 2542.

It has further been discovered that the conductive caps 2562 provide improved reliability by providing increased surface area for the lower interior conductive layer 2514 to form directly thereon for improved interlock thereby eliminating pullout of the leads 2502.

It has further been discovered that the attach layer 2534 attached to the inactive side 2538 and the paddle top side 2554 provides reduced vertical height of the integrated circuit packaging system 2500.

It has further been discovered that a portion of the lower layer top side 2518 exposed from the interior insulation layer 2528 provides improved reliability by eliminating wire shorts with reduced wire span when the internal connectors 2542 are attach to the active side 2540 and the portion of the lower layer top side 2518 that is closest to the integrated circuit 2536.

Figure 26:
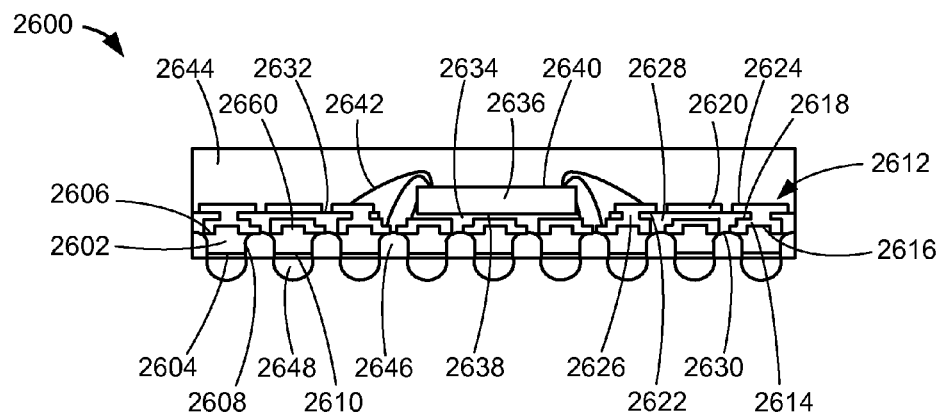
FIG. 26 is a cross-sectional view of an integrated circuit packaging system in a ninth embodiment of the present invention.

Referring now to FIG. 26, therein is shown a cross-sectional view of an integrated circuit packaging system 2600 in a ninth embodiment of the present invention. In a manner similar to the integrated circuit packaging system 100, the integrated circuit packaging system 2600 includes leads 2602, each having a lead bottom side 2604, a lead top side 2606, and a lead non-horizontal side 2608. In a manner similar to the integrated circuit packaging system 100, the integrated circuit packaging system 2600 includes an exterior conductive layer 2610.

In a manner similar to the integrated circuit packaging system 100, the integrated circuit packaging system 2600 includes a multi-layer conductive structure 2612 having a lower interior conductive layer 2614 with a lower layer bottom side 2616 and a lower layer top side 2618. In a manner similar to the integrated circuit packaging system 100, the integrated circuit packaging system 2600 includes the multi-layer conductive structure 2612 having an upper interior conductive layer 2620 with an upper layer bottom side 2622 and an upper layer top side 2624.

In a manner similar to the integrated circuit packaging system 100, the integrated circuit packaging system 2600 includes the multi-layer conductive structure 2612 having an interior connection layer 2626. In a manner similar to the integrated circuit packaging system 100, the integrated circuit packaging system 2600 includes the multi-layer conductive structure 2612 having an interior insulation layer 2628 with an interior insulation bottom side 2630 and an interior insulation top side 2632.

In a manner similar to the integrated circuit packaging system 100, the integrated circuit packaging system 2600 includes an attach layer 2634. In a manner similar to the integrated circuit packaging system 100, the integrated circuit packaging system 2600 includes an integrated circuit 2636 with an inactive side 2638 and an active side 2640. In a manner similar to the integrated circuit packaging system 100, the integrated circuit packaging system 2600 includes internal connectors 2642, an encapsulation 2644, a protection layer 2646, and external connectors 2648.

Each of the leads 2602 can include a lead step portion 2660, which is defined as a portion of each of the leads 2602 that vertically extends from the lead top side 2606. The lower layer bottom side 2616 can be formed directly on a top extent of the lead step portion 2660 and a non-horizontal side of the lead step portion 2660. The integrated circuit 2636 can be mounted directly over the lead step portion 2660 of each of a number of the leads 2602.

The integrated circuit 2636 can be mounted directly over a number of the leads 2602 with the attach layer 2634 attached to the inactive side 2638, the lower layer top side 2618, a portion of a top extent of the protection layer 2646, and a portion of the lead top side 2606. One of the internal connectors 2642 can be attached to the active side 2640 and a portion of the lower layer top side 2618 that is exposed from the interior insulation layer 2628.

It has been discovered that the multi-layer conductive structure 2612 provides improved reliability with the upper interior conductive layer 2620 and the lower interior conductive layer 2614 directly on the lead top side 2606 providing increased spacing for routability thereby providing reduced wire span and eliminating electrical shorts between traces.

It has also been discovered that the protection layer 2646 provides improved reliability with a bottom extent of the protection layer 2646 coplanar with a bottom extent of the exterior conductive layer 2610 and with the lead non-horizontal side 2608 covered by the protection layer 2646 to provide terminal interlocking resulting in elimination of lead pullouts.

It has further been discovered that the upper interior conductive layer 2620 electrically connected to the leads 2602 and the integrated circuit 2636 provides improved reliability by reducing wire span of the internal connectors 2642.

It has further been discovered that the lead step portion 2660 provide improved reliability by providing increased surface area for the lower interior conductive layer 2614 to form directly thereon for improved interlock thereby eliminating pullout of the leads 2602.

It has further been discovered that the lead step portion 2660 provide improved reliability by providing increased surface area for the lower interior conductive layer 2614 to form directly thereon for improved interlock thereby eliminating pullout of the leads 2602.

It has further been discovered that the attach layer 2634 attached to the inactive side 2638, the lower layer top side 2618, a portion of a top extent of the protection layer 2646, and a portion of the lead top side 2606 provides reduced vertical height of the integrated circuit packaging system 2600.

It has further been discovered that a portion of the lower layer top side 2618 exposed from the interior insulation layer 2628 provides improved reliability by eliminating wire shorts with reduced wire span when the internal connectors 2642 are attach to the active side 2640 and the portion of the lower layer top side 2618 that is closest to the integrated circuit 2636.

Figure 27:
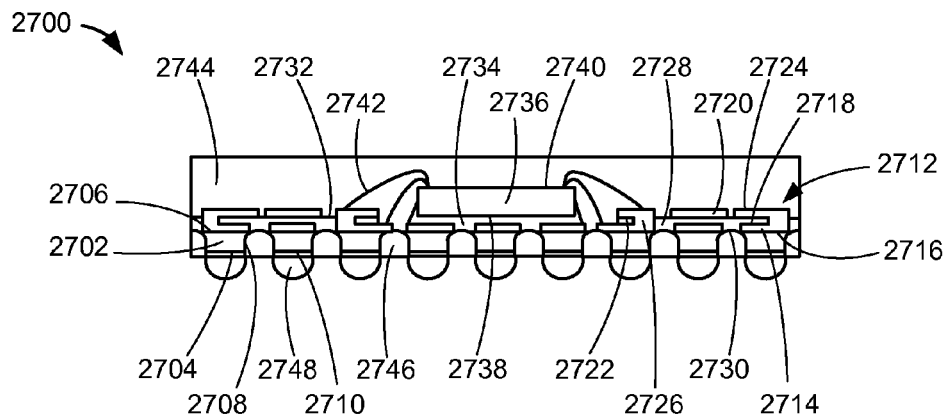
FIG. 27 is a cross-sectional view of an integrated circuit packaging system in a tenth embodiment of the present invention.

Referring now to FIG. 27, therein is shown a cross-sectional view of an integrated circuit packaging system 2700 in a tenth embodiment of the present invention. In a manner similar to the integrated circuit packaging system 100, the integrated circuit packaging system 2700 includes leads 2702, each having a lead bottom side 2704, a lead top side 2706, and a lead non-horizontal side 2708. In a manner similar to the integrated circuit packaging system 100, the integrated circuit packaging system 2700 includes an exterior conductive layer 2710.

In a manner similar to the integrated circuit packaging system 100, the integrated circuit packaging system 2700 includes a multi-layer conductive structure 2712 having a lower interior conductive layer 2714 with a lower layer bottom side 2716 and a lower layer top side 2718. In a manner similar to the integrated circuit packaging system 100, the integrated circuit packaging system 2700 includes the multi-layer conductive structure 2712 having an upper interior conductive layer 2720 with an upper layer bottom side 2722 and an upper layer top side 2724.

In a manner similar to the integrated circuit packaging system 100, the integrated circuit packaging system 2700 includes the multi-layer conductive structure 2712 having an interior connection layer 2726. In a manner similar to the integrated circuit packaging system 100, the integrated circuit packaging system 2700 includes the multi-layer conductive structure 2712 having an interior insulation layer 2728 with an interior insulation bottom side 2730 and an interior insulation top side 2732.

In a manner similar to the integrated circuit packaging system 100, the integrated circuit packaging system 2700 includes an attach layer 2734. In a manner similar to the integrated circuit packaging system 100, the integrated circuit packaging system 2700 includes an integrated circuit 2736 with an inactive side 2738 and an active side 2740. In a manner similar to the integrated circuit packaging system 100, the integrated circuit packaging system 2700 includes internal connectors 2742, an encapsulation 2744, a protection layer 2746, and external connectors 2748.

The integrated circuit 2736 can be mounted directly over a number of the leads 2702 with the attach layer 2734 attached to the inactive side 2738, the lower layer top side 2718, a portion of a top extent of the protection layer 2746, and a portion of the lead top side 2706. One of the internal connectors 2742 can be attached to the active side 2740 and a portion of the lower layer top side 2718 that is exposed from the interior insulation layer 2728.

It has been discovered that the multi-layer conductive structure 2712 provides improved reliability with the upper interior conductive layer 2720 and the lower interior conductive layer 2714 directly on the lead top side 2706 providing increased spacing for routability thereby providing reduced wire span and eliminating electrical shorts between traces.

It has also been discovered that the protection layer 2746 provides improved reliability with a bottom extent of the protection layer 2746 coplanar with a bottom extent of the exterior conductive layer 2710 and with the lead non-horizontal side 2708 covered by the protection layer 2746 to provide terminal interlocking resulting in elimination of lead pullouts.

It has further been discovered that the upper interior conductive layer 2720 electrically connected to the leads 2702 and the integrated circuit 2736 provides improved reliability by reducing wire span of the internal connectors 2742.

It has further been discovered that the attach layer 2734 attached to the inactive side 2738, the lower layer top side 2718, a portion of a top extent of the protection layer 2746, and a portion of the lead top side 2706 provides reduced vertical height of the integrated circuit packaging system 2700.

It has further been discovered that a portion of the lower layer top side 2718 exposed from the interior insulation layer 2728 provides improved reliability by eliminating wire shorts with reduced wire span when the internal connectors 2742 are attach to the active side 2740 and the portion of the lower layer top side 2718 that is closest to the integrated circuit 2736.

Figure 28:
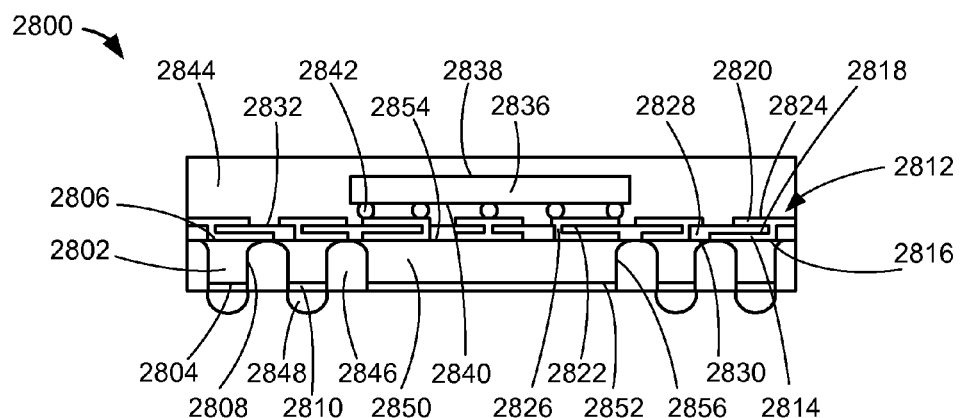
FIG. 28 is a cross-sectional view of an integrated circuit packaging system in an eleventh embodiment of the present invention.

Referring now to FIG. 28, therein is shown a cross-sectional view of an integrated circuit packaging system 2800 in an eleventh embodiment of the present invention. In a manner similar to the integrated circuit packaging system 100, the integrated circuit packaging system 2800 includes leads 2802, each having a lead bottom side 2804, a lead top side 2806, and a lead non-horizontal side 2808. In a manner similar to the integrated circuit packaging system 100, the integrated circuit packaging system 2800 includes an exterior conductive layer 2810.

In a manner similar to the integrated circuit packaging system 100, the integrated circuit packaging system 2800 includes a multi-layer conductive structure 2812 having a lower interior conductive layer 2814 with a lower layer bottom side 2816 and a lower layer top side 2818. In a manner similar to the integrated circuit packaging system 100, the integrated circuit packaging system 2800 includes the multi-layer conductive structure 2812 having an upper interior conductive layer 2820 with an upper layer bottom side 2822 and an upper layer top side 2824.

In a manner similar to the integrated circuit packaging system 100, the integrated circuit packaging system 2800 includes the multi-layer conductive structure 2812 having an interior connection layer 2826. In a manner similar to the integrated circuit packaging system 100, the integrated circuit packaging system 2800 includes the multi-layer conductive structure 2812 having an interior insulation layer 2828 with an interior insulation bottom side 2830 and an interior insulation top side 2832.

In a manner similar to the integrated circuit packaging system 100, the integrated circuit packaging system 2800 includes an integrated circuit 2836 with an inactive side 2838 and an active side 2840. In a manner similar to the integrated circuit packaging system 100, the integrated circuit packaging system 2800 includes internal connectors 2842, an encapsulation 2844, a protection layer 2846, and external connectors 2848.

The integrated circuit packaging system 2800 can include a package paddle 2850, which is defined as a support structure for mounting and attaching a semiconductor device. The package paddle 2850 can include a paddle bottom side 2852 and a paddle top side 2854 opposite the paddle bottom side 2852. The package paddle 2850 can include a paddle non-horizontal side 2856, which is defined as a lateral side that defines a horizontal boundary of the package paddle 2850. The paddle non-horizontal side 2856 extends from the paddle bottom side 2852 to the paddle top side 2854. The paddle non-horizontal side 2856 can include a curved surface.

The lower layer bottom side 2816 can be formed directly on the paddle top side 2854. The integrated circuit 2836 can be mounted directly over the paddle top side 2854 with the internal connectors 2842 attached to the active side 2840 and the upper layer top side 2824. The paddle non-horizontal side 2856 can be completely horizontally surrounded by the leads 2802. The exterior conductive layer 2810 can be formed directly on the paddle bottom side 2852. The protection layer 2846 can be formed directly on the paddle non-horizontal side 2856. A top extent of the protection layer 2846 can be coplanar with the paddle top side 2854.

It has been discovered that the multi-layer conductive structure 2812 provides improved reliability with the upper interior conductive layer 2820 and the lower interior conductive layer 2814 directly on the lead top side 2806 providing increased spacing for routability thereby providing reduced wire span and eliminating electrical shorts between traces.

It has also been discovered that the protection layer 2846 provides improved reliability with a bottom extent of the protection layer 2846 coplanar with a bottom extent of the exterior conductive layer 2810 and with the lead non-horizontal side 2808 and the paddle non-horizontal side 2856 covered by the protection layer 2846 to provide terminal interlocking resulting in elimination of lead pullouts.

It has further been discovered that the upper interior conductive layer 2820 electrically connected to the leads 2802 and the integrated circuit 2836 provides improved reliability by reducing wire span of the internal connectors 2842.

Figure 29:
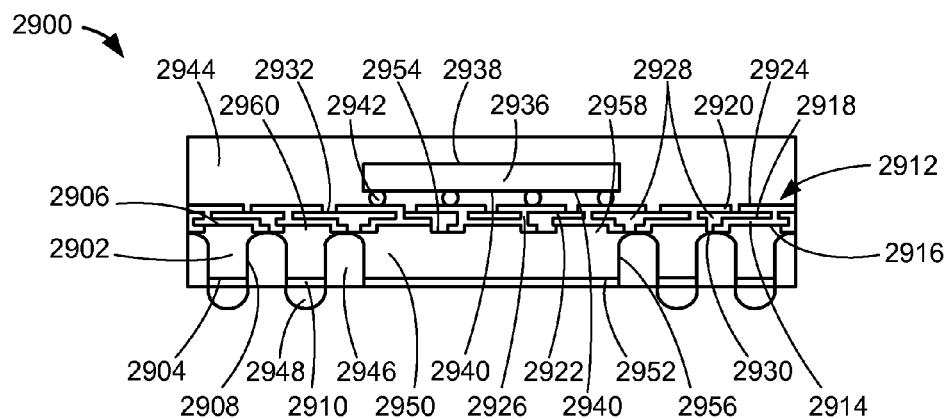
FIG. 29 is a cross-sectional view of an integrated circuit packaging system in a twelfth embodiment of the present invention.

Referring now to FIG. 29, therein is shown a cross-sectional view of an integrated circuit packaging system 2900 in a twelfth embodiment of the present invention. In a manner similar to the integrated circuit packaging system 100, the integrated circuit packaging system 2900 includes leads 2902, each having a lead bottom side 2904, a lead top side 2906, and a lead non-horizontal side 2908. In a manner similar to the integrated circuit packaging system 100, the integrated circuit packaging system 2900 includes an exterior conductive layer 2910.

In a manner similar to the integrated circuit packaging system 100, the integrated circuit packaging system 2900 includes a multi-layer conductive structure 2912 having a lower interior conductive layer 2914 with a lower layer bottom side 2916 and a lower layer top side 2918. In a manner similar to the integrated circuit packaging system 100, the integrated circuit packaging system 2900 includes the multi-layer conductive structure 2912 having an upper interior conductive layer 2920 with an upper layer bottom side 2922 and an upper layer top side 2924.

In a manner similar to the integrated circuit packaging system 100, the integrated circuit packaging system 2900 includes the multi-layer conductive structure 2912 having an interior connection layer 2926. In a manner similar to the integrated circuit packaging system 100, the integrated circuit packaging system 2900 includes the multi-layer conductive structure 2912 having an interior insulation layer 2928 with an interior insulation bottom side 2930 and an interior insulation top side 2932.

In a manner similar to the integrated circuit packaging system 100, the integrated circuit packaging system 2900 includes an integrated circuit 2936 with an inactive side 2938 and an active side 2940. In a manner similar to the integrated circuit packaging system 100, the integrated circuit packaging system 2900 includes internal connectors 2942, an encapsulation 2944, a protection layer 2946, and external connectors 2948.

The integrated circuit packaging system 2900 can include a package paddle 2950, which is defined as a support structure for mounting and attaching a semiconductor device. The package paddle 2950 can include a paddle bottom side 2952 and a paddle top side 2954 opposite the paddle bottom side 2952. The package paddle 2950 can include a paddle non-horizontal side 2956, which is defined as a lateral side that defines a horizontal boundary of the package paddle 2950. The paddle non-horizontal side 2956 extends from the paddle bottom side 2952 to the paddle top side 2954. The paddle non-horizontal side 2956 can include a curved surface.

The package paddle 2950 can include paddle step portions 2958, which is defined as a portion of the package paddle 2950 that vertically extends from the paddle top side 2954. Each of the leads 2902 can include a lead step portion 2960, which is defined as a portion of each of the leads 2902 that vertically extends from the lead top side 2906. The lower layer bottom side 2916 can be formed directly on top extents of the paddle step portions 2958, non-horizontal sides of the paddle step portions 2958, a top extent of the lead step portion 2960, and a non-horizontal side of the lead step portion 2960.

The integrated circuit 2936 can be mounted directly over the paddle top side 2954 and top extents of the paddle step portions 2958 with the internal connectors 2942 attached to the active side 2940 and the upper layer top side 2924. The paddle non-horizontal side 2956 can be completely horizontally surrounded by the leads 2902. The exterior conductive layer 2910 can be formed directly on the paddle bottom side 2952. The protection layer 2946 can be formed directly on the paddle non-horizontal side 2956. A top extent of the protection layer 2946 can be coplanar with the paddle top side 2954.

It has been discovered that the multi-layer conductive structure 2912 provides improved reliability with the upper interior conductive layer 2920 and the lower interior conductive layer 2914 directly on the lead top side 2906 providing increased spacing for routability thereby providing reduced wire span and eliminating electrical shorts between traces.

It has also been discovered that the protection layer 2946 provides improved reliability with a bottom extent of the protection layer 2946 coplanar with a bottom extent of the exterior conductive layer 2910 and with the lead non-horizontal side 2908 and the paddle non-horizontal side 2956 covered by the protection layer 2946 to provide terminal interlocking resulting in elimination of lead pullouts.

It has further been discovered that the upper interior conductive layer 2920 electrically connected to the leads 2902 and the integrated circuit 2936 provides improved reliability by reducing wire span of the internal connectors 2942.

It has further been discovered that the paddle step portions 2958 and the lead step portion 2960 provide improved reliability by providing increased surface area for the lower interior conductive layer 2914 to form directly thereon for improved interlock thereby eliminating pullout of the package paddle 2950 and the leads 2902.

Figure 30:
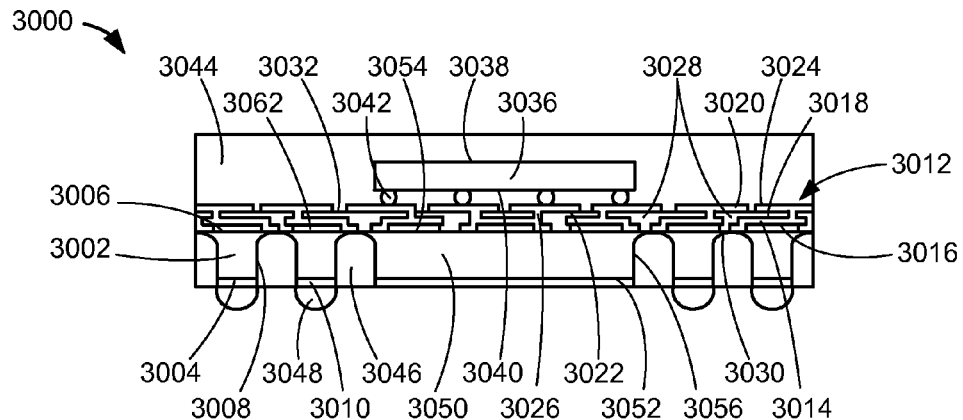
FIG. 30 is a cross-sectional view of an integrated circuit packaging system in a thirteenth embodiment of the present invention.

Referring now to FIG. 30, therein is shown a cross-sectional view of an integrated circuit packaging system 3000 in a thirteenth embodiment of the present invention. In a manner similar to the integrated circuit packaging system 100, the integrated circuit packaging system 3000 includes leads 3002, each having a lead bottom side 3004, a lead top side 3006, and a lead non-horizontal side 3008. In a manner similar to the integrated circuit packaging system 100, the integrated circuit packaging system 3000 includes an exterior conductive layer 3010.

In a manner similar to the integrated circuit packaging system 100, the integrated circuit packaging system 3000 includes a multi-layer conductive structure 3012 having a lower interior conductive layer 3014 with a lower layer bottom side 3016 and a lower layer top side 3018. In a manner similar to the integrated circuit packaging system 100, the integrated circuit packaging system 3000 includes the multi-layer conductive structure 3012 having an upper interior conductive layer 3020 with an upper layer bottom side 3022 and an upper layer top side 3024.

In a manner similar to the integrated circuit packaging system 100, the integrated circuit packaging system 3000 includes the multi-layer conductive structure 3012 having an interior connection layer 3026. In a manner similar to the integrated circuit packaging system 100, the integrated circuit packaging system 3000 includes the multi-layer conductive structure 3012 having an interior insulation layer 3028 with an interior insulation bottom side 3030 and an interior insulation top side 3032.

In a manner similar to the integrated circuit packaging system 100, the integrated circuit packaging system 3000 includes an integrated circuit 3036 with an inactive side 3038 and an active side 3040. In a manner similar to the integrated circuit packaging system 100, the integrated circuit packaging system 3000 includes internal connectors 3042, an encapsulation 3044, a protection layer 3046, and external connectors 3048.

The integrated circuit packaging system 3000 can include a package paddle 3050, which is defined as a support structure for mounting and attaching a semiconductor device. The package paddle 3050 can include a paddle bottom side 3052 and a paddle top side 3054 opposite the paddle bottom side 3052. The package paddle 3050 can include a paddle non-horizontal side 3056, which is defined as a lateral side that defines a horizontal boundary of the package paddle 3050. The paddle non-horizontal side 3056 extends from the paddle bottom side 3052 to the paddle top side 3054. The paddle non-horizontal side 3056 can include a curved surface.

The integrated circuit packaging system 3000 can include conductive caps 3062, which are defined as layers of an electrically conductive material. The conductive caps 3062 can be formed directly on the lead top side 3006 and the paddle top side 3054. The lower layer bottom side 3016 can be formed directly on top extents of the conductive caps 3062 and non-horizontal sides of the conductive caps 3062.

The integrated circuit 3036 can be mounted directly over the paddle top side 3054 and top extents of the conductive caps 3062 with the internal connectors 3042 attached to the active side 3040 and the upper layer top side 3024. The paddle non-horizontal side 3056 can be completely horizontally surrounded by the leads 3002. The exterior conductive layer 3010 can be formed directly on the paddle bottom side 3052. The protection layer 3046 can be formed directly on the paddle non-horizontal side 3056. A top extent of the protection layer 3046 can be coplanar with the paddle top side 3054.

It has been discovered that the multi-layer conductive structure 3012 provides improved reliability with the upper interior conductive layer 3020 and the lower interior conductive layer 3014 directly on the lead top side 3006 providing increased spacing for routability thereby providing reduced wire span and eliminating electrical shorts between traces.

It has also been discovered that the protection layer 3046 provides improved reliability with a bottom extent of the protection layer 3046 coplanar with a bottom extent of the exterior conductive layer 3010 and with the lead non-horizontal side 3008 and the paddle non-horizontal side 3056 covered by the protection layer 3046 to provide terminal interlocking resulting in elimination of lead pullouts.

It has further been discovered that the upper interior conductive layer 3020 electrically connected to the leads 3002 and the integrated circuit 3036 provides improved reliability by reducing wire span of the internal connectors 3042.

It has further been discovered that the conductive caps 3062 provide improved reliability by providing increased surface area for the lower interior conductive layer 3014 to form directly thereon for improved interlock thereby eliminating pullout of the package paddle 3050 and the leads 3002.

Figure 31:
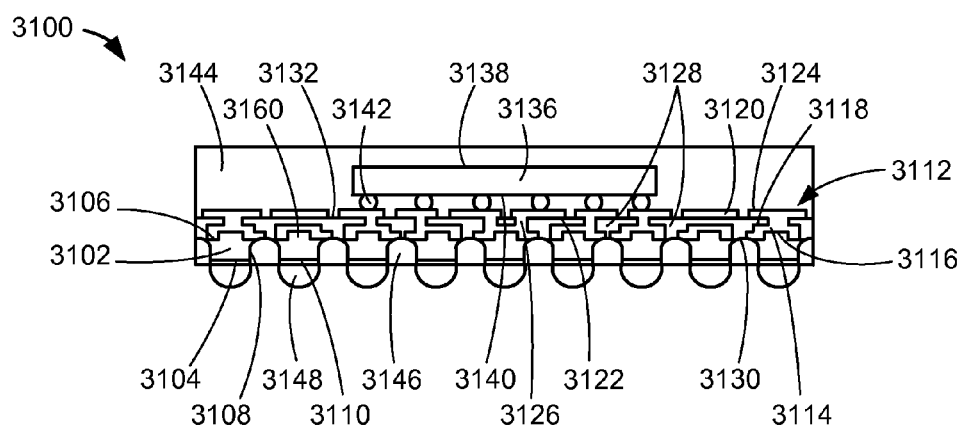
FIG. 31 is a cross-sectional view of an integrated circuit packaging system in a fourteenth embodiment of the present invention.

Referring now to FIG. 31, therein is shown a cross-sectional view of an integrated circuit packaging system 3100 in a fourteenth embodiment of the present invention. In a manner similar to the integrated circuit packaging system 100, the integrated circuit packaging system 3100 includes leads 3102, each having a lead bottom side 3104, a lead top side 3106, and a lead non-horizontal side 3108. In a manner similar to the integrated circuit packaging system 100, the integrated circuit packaging system 3100 includes an exterior conductive layer 3110.

In a manner similar to the integrated circuit packaging system 100, the integrated circuit packaging system 3100 includes a multi-layer conductive structure 3112 having a lower interior conductive layer 3114 with a lower layer bottom side 3116 and a lower layer top side 3118. In a manner similar to the integrated circuit packaging system 100, the integrated circuit packaging system 3100 includes the multi-layer conductive structure 3112 having an upper interior conductive layer 3120 with an upper layer bottom side 3122 and an upper layer top side 3124.

In a manner similar to the integrated circuit packaging system 100, the integrated circuit packaging system 3100 includes the multi-layer conductive structure 3112 having an interior connection layer 3126. In a manner similar to the integrated circuit packaging system 100, the integrated circuit packaging system 3100 includes the multi-layer conductive structure 3112 having an interior insulation layer 3128 with an interior insulation bottom side 3130 and an interior insulation top side 3132.

In a manner similar to the integrated circuit packaging system 100, the integrated circuit packaging system 3100 includes an integrated circuit 3136 with an inactive side 3138 and an active side 3140. In a manner similar to the integrated circuit packaging system 100, the integrated circuit packaging system 3100 includes internal connectors 3142, an encapsulation 3144, a protection layer 3146, and external connectors 3148.

Each of the leads 3102 can include a lead step portion 3160, which is defined as a portion of each of the leads 3102 that vertically extends from the lead top side 3106. The lower layer bottom side 3116 can be formed directly on a top extent of the lead step portion 3160 and a non-horizontal side of the lead step portion 3160. The integrated circuit 3136 can be mounted directly over the lead step portion 3160 of each of a number of the leads 3102 with the internal connectors 3142 attached to the active side 3140 and the upper layer top side 3124.

It has been discovered that the multi-layer conductive structure 3112 provides improved reliability with the upper interior conductive layer 3120 and the lower interior conductive layer 3114 directly on the lead top side 3106 providing increased spacing for routability thereby providing reduced wire span and eliminating electrical shorts between traces.

It has also been discovered that the protection layer 3146 provides improved reliability with a bottom extent of the protection layer 3146 coplanar with a bottom extent of the exterior conductive layer 3110 and with the lead non-horizontal side 3108 covered by the protection layer 3146 to provide terminal interlocking resulting in elimination of lead pullouts.

It has further been discovered that the upper interior conductive layer 3120 electrically connected to the leads 3102 and the integrated circuit 3136 provides improved reliability by reducing wire span of the internal connectors 3142.

It has further been discovered that the lead step portion 3160 provide improved reliability by providing increased surface area for the lower interior conductive layer 3114 to form directly thereon for improved interlock thereby eliminating pullout of the leads 3102.

Figure 32:
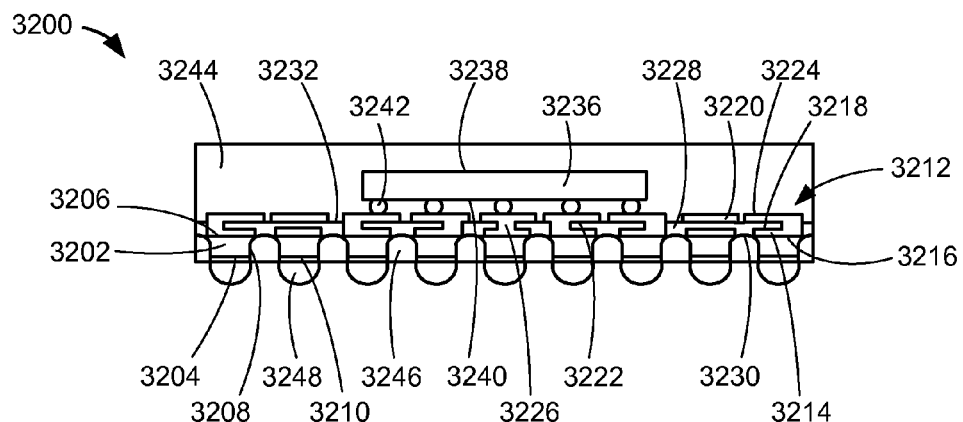
FIG. 32 is a cross-sectional view of an integrated circuit packaging system in a fifteenth embodiment of the present invention.

Referring now to FIG. 32, therein is shown a cross-sectional view of an integrated circuit packaging system 3200 in a fifteenth embodiment of the present invention. In a manner similar to the integrated circuit packaging system 100, the integrated circuit packaging system 3200 includes leads 3202, each having a lead bottom side 3204, a lead top side 3206, and a lead non-horizontal side 3208. In a manner similar to the integrated circuit packaging system 100, the integrated circuit packaging system 3200 includes an exterior conductive layer 3210.

In a manner similar to the integrated circuit packaging system 100, the integrated circuit packaging system 3200 includes a multi-layer conductive structure 3212 having a lower interior conductive layer 3214 with a lower layer bottom side 3216 and a lower layer top side 3218. In a manner similar to the integrated circuit packaging system 100, the integrated circuit packaging system 3200 includes the multi-layer conductive structure 3212 having an upper interior conductive layer 3220 with an upper layer bottom side 3222 and an upper layer top side 3224.

In a manner similar to the integrated circuit packaging system 100, the integrated circuit packaging system 3200 includes the multi-layer conductive structure 3212 having an interior connection layer 3226. In a manner similar to the integrated circuit packaging system 100, the integrated circuit packaging system 3200 includes the multi-layer conductive structure 3212 having an interior insulation layer 3228 with an interior insulation bottom side 3230 and an interior insulation top side 3232.

In a manner similar to the integrated circuit packaging system 100, the integrated circuit packaging system 3200 includes an integrated circuit 3236 with an inactive side 3238 and an active side 3240. In a manner similar to the integrated circuit packaging system 100, the integrated circuit packaging system 3200 includes internal connectors 3242, an encapsulation 3244, a protection layer 3246, and external connectors 3248. The integrated circuit 3236 can be mounted directly over a number of the leads 3202 with the internal connectors 3242 attached to the active side 3240 and the upper layer top side 3224.

It has been discovered that the multi-layer conductive structure 3212 provides improved reliability with the upper interior conductive layer 3220 and the lower interior conductive layer 3214 directly on the lead top side 3206 providing increased spacing for routability thereby providing reduced wire span and eliminating electrical shorts between traces.

It has also been discovered that the protection layer 3246 provides improved reliability with a bottom extent of the protection layer 3246 coplanar with a bottom extent of the exterior conductive layer 3210 and with the lead non-horizontal side 3208 covered by the protection layer 3246 to provide terminal interlocking resulting in elimination of lead pullouts.

It has further been discovered that the upper interior conductive layer 3220 electrically connected to the leads 3202 and the integrated circuit 3236 provides improved reliability by reducing wire span of the internal connectors 3242.

Figure 33:
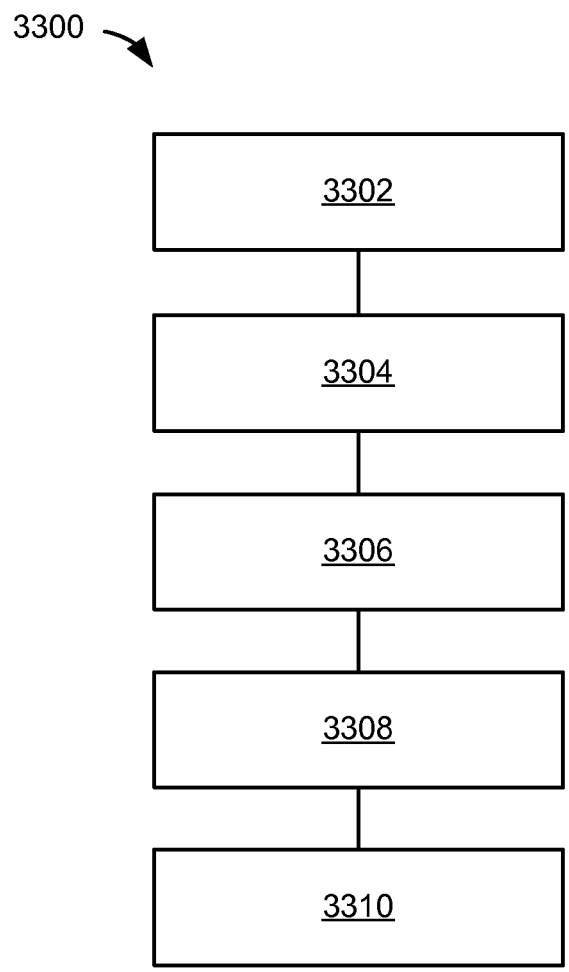
FIG. 33 is a flow chart of a method of manufacture of the integrated circuit packaging system in a further embodiment of the present invention.

Referring now to FIG. 33, therein is shown a flow chart of a method 3300 of manufacture of the integrated circuit packaging system 100 in a further embodiment of the present invention. The method 3300 includes: forming a lead having a lead top side in a block 3302; forming a lower interior conductive layer directly on the lead top side in a block 3304; forming an interior insulation layer directly on the lower interior conductive layer in a block 3306; forming an upper interior conductive layer directly on the interior insulation layer in a block 3308; and mounting an integrated circuit over the upper interior conductive layer in a block 3310.

Thus, it has been discovered that the integrated circuit packaging system of the present invention furnishes important and heretofore unknown and unavailable solutions, capabilities, and functional aspects for an integrated circuit packaging system with terminals. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
  forming a lower interior conductive layer directly on a carrier having an exterior conductive layer, the lower interior conductive layer on a side of the carrier opposite from the exterior conductive layer, and the lower interior conductive layer having a lower layer top side;
  forming an interior insulation layer directly on the lower interior conductive layer, the lower interior conductive layer within the interior insulation layer, and the lower layer top side of the lower interior conductive layer coplanar with an interior insulation bottom side of the interior insulation layer;
  removing a portion of the carrier to form a lead having a lead top side wider than a lead bottom side, the lead for conducting electrical signals, and the lead top side coplanar with the lower layer top side of the lower interior conductive layer with the lead having a curved surface extending from the lead top side to the lead bottom side;
  forming a protection layer directly on a bottom side of the lower interior conductive layer, a lead non-horizontal side, the exterior conductive layer, and a bottom extent of the interior insulation layer, the protection layer coplanar with a lead top side;
  forming an upper interior conductive layer directly on the interior insulation layer, the upper interior conductive layer having an upper contact for attaching an internal connector;
  mounting an integrated circuit over the upper interior conductive layer, the integrated circuit attached to the upper contact with the internal connector; and
  forming an encapsulation over the integrated circuit, the internal connector, and the upper interior conductive layer to hermetically seal the integrated circuit for environmental protection.

2. The method as claimed in claim 1 wherein mounting the integrated circuit includes mounting the integrated circuit directly over the lead.

3. The method as claimed in claim 1 further comprising:
  forming a package paddle adjacent the lead; and
  wherein:

forming the lower interior conductive layer includes forming the lower interior conductive layer directly on the package paddle.

4. The method as claimed in claim 1 wherein:
forming the lead includes forming the lead having a lead step portion; and
forming the lower interior conductive layer includes forming the lower interior conductive layer directly on the lead step portion.

5. The method as claimed in claim 1 further comprising forming a conductive cap directly on the lead top side.

6. A method of manufacture of an integrated circuit packaging system comprising:
forming a lower interior conductive layer directly on a carrier having an exterior conductive layer, the lower interior conductive layer on a side of the carrier opposite from the exterior conductive layer, and the lower interior conductive layer having a lower layer top side;
forming an interior insulation layer directly on the lower interior conductive layer;
removing a portion of the carrier to form a lead having a lead top side wider than lead bottom side, the lead for conducting electrical signals, and the lead top side coplanar with the lower layer top side of the lower interior conductive layer with a non-horizontal side of the lead extending from the lead top side to the lead bottom side;
forming an upper interior conductive layer directly on the interior insulation layer, the upper interior conductive layer having an upper contact for attaching an internal connector, the lower interior conductive layer within the interior insulation layer, and the lower layer top side of the lower interior conductive layer coplanar with an interior insulation bottom side of the interior insulation layer and the lead top side;
mounting an integrated circuit over the upper interior conductive layer, the integrated circuit attached to the upper contact with the internal connector;
forming a protection layer directly on a bottom side of the lower interior conductive layer, a lead non-horizontal side, the exterior conductive layer, and a bottom extent of the interior insulation layer, the protection layer coplanar with a lead top side; and
forming an encapsulation over the integrated circuit, the internal connector, and the upper interior conductive layer to hermetically seal the integrated circuit for environmental protection.

7. The method as claimed in claim 6 further comprising:
forming a package paddle adjacent the lead; and
attaching an attach layer to the package paddle and the integrated circuit.

8. The method as claimed in claim 6 further comprising attaching an internal connector to the integrated circuit and the lower interior conductive layer.

9. The method as claimed in claim 6 further comprising attaching an attach layer to the integrated circuit and the lower interior conductive layer.

10. The method as claimed in claim 6 wherein mounting the integrated circuit includes mounting a flip chip over the upper interior conductive layer.

11. An integrated circuit packaging system comprising:
a lower interior conductive layer directly on a lead top side, the lower interior conductive layer having a lower layer top side;
an interior insulation layer directly on the lower interior conductive layer, the lower interior conductive layer within the interior insulation layer, and the lower layer top side of the lower interior conductive layer coplanar with an interior insulation bottom side of the interior insulation layer and the lead top side;
a lead having a lead top side wider than a lead bottom side, the lead for conducting electrical signals, and the lead top side coplanar with the lower layer top side of the lower interior conductive layer with the lead having a curved surface extending from the lead top side to the lead bottom side;
an exterior conductive layer directly on the lead bottom side;
a protection layer directly on a bottom side of the lower interior conductive layer, a lead non-horizontal side, the exterior conductive laver, and a bottom extent of the interior insulation layer, the protection layer coplanar with a lead top side;
an upper interior conductive layer directly on the interior insulation layer, the upper interior conductive layer having an upper contact for attaching an internal connector;
an integrated circuit over the upper interior conductive layer, the integrated circuit attached to the upper contact with the internal connector; and
an encapsulation over the integrated circuit, the internal connector, and the upper interior conductive layer to hermetically seal the integrated circuit for environmental protection.

12. The system as claimed in claim 11 wherein the integrated circuit is directly over the lead.

13. The system as claimed in claim 11 further comprising:
a package paddle adjacent the lead; and
wherein:
the lower interior conductive layer is directly on the package paddle.

14. The system as claimed in claim 11 wherein:
the lead includes a lead step portion; and
the lower interior conductive layer is directly on the lead step portion.

15. The system as claimed in claim 11 further comprising a conductive cap directly on the lead top side.

16. The system as claimed in claim 11 wherein the lower interior conductive layer is within the interior insulation layer and the lower layer top side of the lower interior conductive layer coplanar with an interior insulation bottom side of the interior insulation layer and the lead top side.

17. The system as claimed in claim 16 further comprising:
a package paddle adjacent the lead; and
an attach layer attached to the package paddle and the integrated circuit.

18. The system as claimed in claim 16 further comprising an internal connector attached to the integrated circuit and the lower interior conductive layer.

19. The system as claimed in claim 16 further comprising an attach layer attached to the integrated circuit and the lower interior conductive layer.

20. The system as claimed in claim 16 wherein the integrated circuit is a flip chip over the upper interior conductive layer.

* * * * *